US012672430B2

(12) United States Patent
Kim et al.

(10) Patent No.: US 12,672,430 B2
(45) Date of Patent: Jun. 30, 2026

(54) DISPLAY DEVICE

(71) Applicant: SAMSUNG DISPLAY CO., LTD.,
Yongin-si (KR)

(72) Inventors: Kihwan Kim, Yongin-si (KR);
Jeongmoo Kwon, Yongin-si (KR);
Beom Jin Kim, Yongin-si (KR);
Sangik Oh, Yongin-si (KR); **Bumsuk
Lee, Yongin-si (KR); Hyunggi Jung**,
Yongin-si (KR); Hyungtae Jung,
Yongin-si (KR)

(73) Assignee: SAMSUNG DISPLAY CO., LTD.,
Yongin-si (KR)

( * ) Notice: Subject to any disclaimer, the term of this
patent is extended or adjusted under 35
U.S.C. 154(b) by 472 days.

(21) Appl. No.: 18/311,600

(22) Filed: May 3, 2023

(65) Prior Publication Data

US 2024/0023373 A1     Jan. 18, 2024

(30) Foreign Application Priority Data

Jul. 18, 2022     (KR) ........................ 10-2022-0088337

(51) Int. Cl.
*H10K 59/121*     (2023.01)
*G09G 3/3266*     (2016.01)
*H10K 59/131*     (2023.01)

(52) U.S. Cl.
CPC ....... *H10K 59/1213* (2023.02); *G09G 3/3266*
(2013.01); *H10K 59/1216* (2023.02); *H10K
59/131* (2023.02); *G09G 2310/08* (2013.01)

(58) Field of Classification Search
CPC ........... H10K 59/1213; H10K 59/1216; H10K
59/131; H10K 59/12; H10K 59/1315;
(Continued)

(56) References Cited

U.S. PATENT DOCUMENTS 11,222,585 B2     1/2022  Cai
2007/0229417 A1 * 10/2007  Giraldo ................ G09G 3/3233
345/82
(Continued)

FOREIGN PATENT DOCUMENTS

CN          113516940      10/2021
KR          10-1491152      2/2015
(Continued)

*Primary Examiner* — Chad M Dicke
*Assistant Examiner* — Gary Abel
(74) *Attorney, Agent, or Firm* — F. CHAU &
ASSOCIATES, LLC

(57)          ABSTRACT
Display device include pixels having a first transistor includ-
ing a control electrode connected to a first node, a first
electrode receiving a first voltage, and a second electrode
connected to a second node, a second transistor including a
first electrode connected to a data line, a second electrode
connected to the first node, and a control electrode con-
nected to a first scan line, a first-first transistor including a
control electrode connected to a first-first node, a first
electrode receiving the first voltage, and a second electrode
connected to the second node, and a second-first transistor
including a first electrode connected to the data line, a
second electrode connected to the first-first node, and a
control electrode connected to a second scan line. An
initialization voltage is applied to the second node. First and
second scan signals are applied to the first and second scan
lines in first and second frames.

20 Claims, 14 Drawing Sheets

(58) Field of Classification Search
CPC ............. G09G 3/3266; G09G 2310/08; G09G
2300/0814; G09G 2300/0852; G09G
2310/0262; G09G 2320/0295; G09G
2320/045; G09G 3/3233; G09G 3/20;
G09G 3/3208; G09G 3/3225; G09G
2300/08; G09G 2310/0202; G09G
2310/0243; G09G 2310/0264; G09G
2300/0426; G09G 2300/0842; G09G
2310/061; G09G 2320/043
See application file for complete search history.

(56) References Cited

U.S. PATENT DOCUMENTS

| | | | | |
|---|---|---|---|---|
| 2008/0231622 A1* | 9/2008 | Honda | ................. | G09G 3/3648 345/211 |
| 2011/0279422 A1* | 11/2011 | Byun | ................... | G09G 3/3208 345/204 |
| 2021/0056890 A1* | 2/2021 | Kim | ..................... | G09G 3/3233 |
| 2021/0407383 A1* | 12/2021 | Lai | ....................... | G09G 3/3233 |
| 2022/0069165 A1 | 3/2022 | Shin et al. | | |

FOREIGN PATENT DOCUMENTS

| | | | | | |
|---|---|---|---|---|---|
| KR | 20170080147 A | * | 7/2017 | .......... | G09G 3/3233 |
| KR | 10-2022-0026626 | | 3/2022 | | |

* cited by examiner

DISPLAY DEVICE

CROSS-REFERENCE TO RELATED APPLICATION

This U.S. nonprovisional application claims priority under 35 U.S.C § 119 to Korean Patent Application No. 10-2022-0088337 filed on Jul. 18, 2022 in the Korean Intellectual Property Office, the disclosure of which is incorporated by reference in its entirety herein.

1. TECHNICAL FIELD

The present invention relates to a display device.

2. DISCUSSION OF RELATED ART

Electronic products such as smart phones, digital cameras, laptop computers, navigation systems, and smart televisions include a display device for displaying an image to users. The display device generates an image and provides users with the image displayed on a display screen.

The display includes a display panel including a plurality of pixels for generating images, a scan driver that applies scan signals to the pixels, a data driver that applies data voltages to the pixels, and a voltage generator that applies operating voltages to the pixels. The pixels may receive data voltages in response to the scan signals, and may generate an image by using the data voltages and the operating voltages.

The pixels include transistors and light emitting elements connected to the transistors. An increase in use time of the pixels may cause degradation of the transistors. The degradation of the transistors may change I-V curves of the transistors, may reduce performance of the transistors, and may decrease lifespans of the transistors.

SUMMARY

At least one embodiment of the present invention provides a display device in which degradation of a driver transistor of a pixel is prevented to increase a lifespan of the driver transistor.

According to an embodiment of the present invention, a display device includes a plurality of pixels. Each of the pixels includes: a first transistor including a control electrode connected to a first node, a first electrode that receives a first voltage, and a second electrode connected to a second node; a second transistor including a first electrode connected to a data line, a second electrode connected to the first node, and a control electrode connected to a first scan line; a first-first transistor including a control electrode connected to a first-first node, a first electrode that receives the first voltage, and a second electrode connected to the second node; a second-first transistor including a first electrode connected to the data line, a second electrode connected to the first-first node, and a control electrode connected to a second scan line; a light emitting element connected to the second node and receiving a second voltage; a first capacitor connected to the first node and the second node; and a second capacitor connected to the first-first node and the second node. An initialization voltage is applied to the second node. In a first frame period, a first scan signal is applied to the first scan line. In a second frame period next to the first frame period, a second scan signal is applied to the second scan line.

According to an embodiment of the present invention, a display device includes a plurality of pixels. Each of the pixels includes: a first transistor including a control electrode connected to a first node, a first electrode that receives a first voltage, and a second electrode connected to a second node; a second transistor including a first electrode connected to a first data line, a second electrode connected to the first node, and a control electrode connected to a scan line; a first-first transistor including a control electrode connected to a first-first node, a first electrode that receives the first voltage, and a second electrode connected to the second node; a second-first transistor including a first electrode connected to a second data line, a second electrode connected to the first-first node, and a control electrode connected to the scan line; a light emitting element connected to the second node and receiving a second voltage; a first capacitor connected to the first node and the second node; and a second capacitor connected to the first-first node and the second node. An initialization voltage may be applied to the second node. In a first frame period, a first data voltage is applied to the first data line. The first-first transistor has a negative gate-source voltage.

According to an embodiment of the present invention, a display device includes a pixel and a timing controller. The pixel includes a first transistor including a control electrode connected to a first node, a first electrode that receives a first voltage, and a second electrode connected to a second node; a second transistor including a first electrode connected to a data line, a second electrode connected to the first node, and a control electrode connected to a first scan line; a first-first transistor including a control electrode connected to a first-first node, a first electrode that receives the first voltage, and a second electrode connected to the second node; a second-first transistor including a first electrode connected to the data line, a second electrode connected to the first-first node, and a control electrode connected to a second scan line; a light emitting element connected to the second node and receiving a second voltage; a first capacitor connected to the first node and the second node; and a second capacitor connected to the first-first node and the second node. The timing controller is configured to turn on the second transistor and turn off the second-first transistor in a first frame period, and turn off the second transistor and turn on the second-first transistor in a second frame period adjacent the first frame period. In an embodiment, the pixel further includes a third transistor including a first electrode connected to a sensing line, a second electrode connected to the second node, and a control electrode connected to a sensing scan line. In an embodiment, the timing controller applies a reference voltage through the data line to the first node during a sensing duration, receives a sensing voltage from the sensing line, determines a threshold voltage from the reference voltage and the sensing voltage, and determines whether the pixel has degraded from the threshold voltage.

BRIEF DESCRIPTION OF THE DRAWINGS

FIG. 7 illustrates a timing diagram of signals for driving a pixel depicted in FIG. 6.

DETAILED DESCRIPTION

Figure 1:
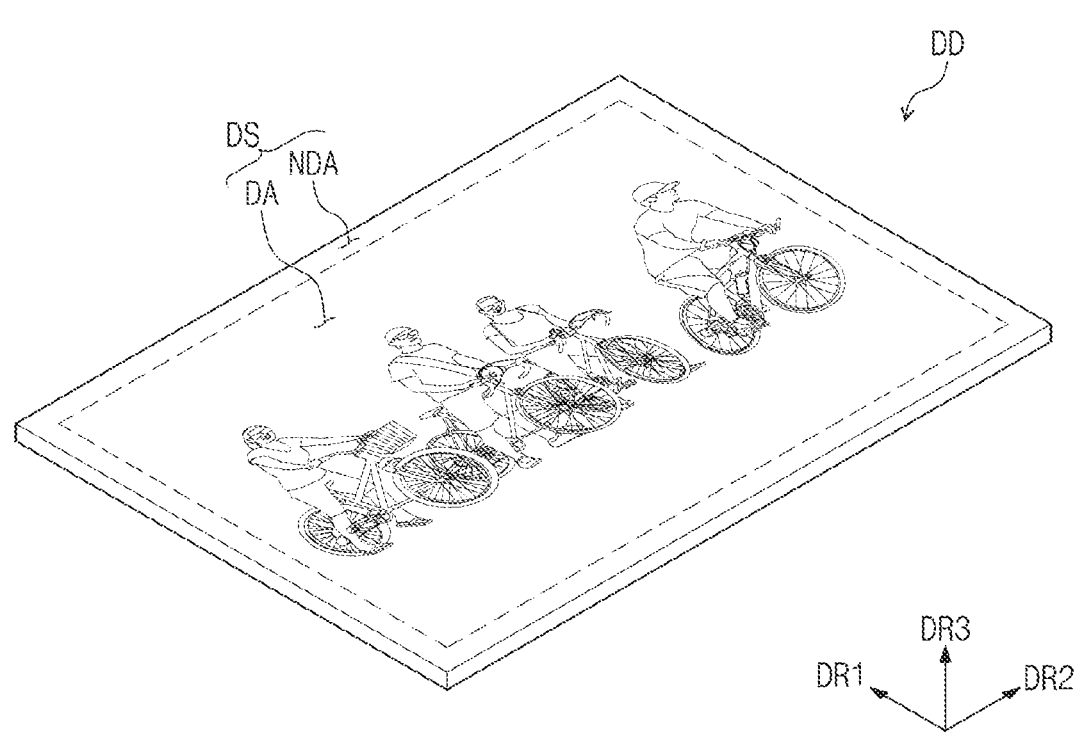
FIG. 1 illustrates a perspective view showing a display device according to an embodiment of the present invention.

In this description, when a certain component (or region, layer, portion, etc.) is referred to as being "on", "connected to", or "coupled to" other component(s), the certain component may be directly disposed on, directly connected to, or directly coupled to the other component(s) or at least one intervening component may be present therebetween.

Like numerals indicate like components. Moreover, in the drawings, thicknesses, ratios, and dimensions of components may be exaggerated for effectively explaining the technical contents.

The term "and/or" includes one or more combinations defined by associated components.

It will be understood that, although the terms first, second, etc. may be used herein to describe various components, these components should not be limited by these terms. These terms are only used to distinguish one component from another component. For example, a first component could be termed a second component, and vice versa without departing from the scope of the present invention. Unless the context clearly indicates otherwise, the singular forms are intended to include the plural forms as well.

In addition, the terms "beneath", "lower", "above", "upper", and the like are used herein to describe one component's relationship to other component(s) illustrated in the drawings. The relative terms are intended to encompass different orientations in addition to the orientation depicted in the drawings.

It should be understood that the terms "comprise", "include", "have", and the like are used to specify the presence of stated features, integers, steps, operations, components, elements, or combinations thereof, but do not preclude the presence or addition of one or more other features, integers, steps, operations, components, elements, or combinations thereof.

The following will now describe some embodiments of the present invention in conjunction with the accompanying drawings.

FIG. 1 illustrates a perspective view showing a display device according to an embodiment of the present invention.

Referring to FIG. 1, a display device DD may have a plane defined by first and second directions DR1 and DR2. The display device DD may have a rectangular shape with shorter sides that extend in the first direction DR1 and longer sides that extend in the second direction DR2. The present invention, however, is not limited thereto, and the display device DD may have a circular shape, a polygonal shape, or any other suitable shapes.

The display device DD may have a top surface defined as a display surface DS, and the top surface may have a plane defined by the first and second directions DR1 and DR2. The display surface DS may provide users with an image generated from the display device DD.

The display surface DS may include a display area DA and a non-display area NDA around the display area DA. The display area DA may display an image, and the non-display area NDA may display no image. The non-display area NDA may surround the display area DA and may provide the display device DD with an edge that is printed with a certain color.

The display device DD may be used for large-sized display apparatuses such as televisions, monitors, or outdoor billboards. In addition, the display device DD may be used for small and medium-sized electronic products, such as personal computers, laptop computers, personal digital terminals, automotive navigation systems, game consoles, smart phones, tablet computers, or cameras. These products are presented by way of example and the display device DD may be used for any other electronic products without departing from the present inventive concept.

Figure 2:
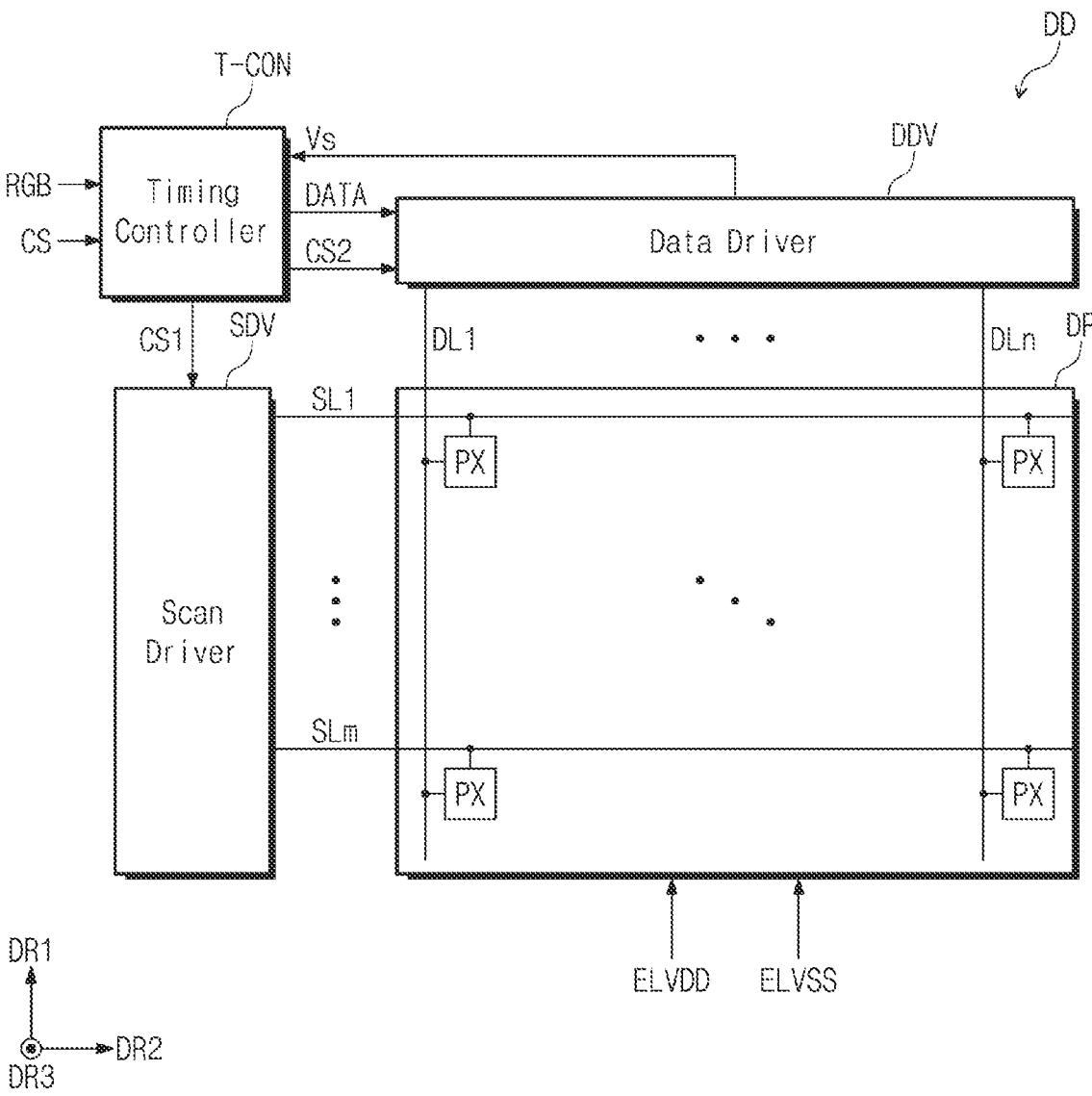
FIG. 2 illustrates a block diagram showing a display device depicted in FIG. 1.

FIG. 2 illustrates a block diagram showing a display device depicted in FIG. 1.

Referring to FIG. 2, the display device DD may include a display panel DP, a scan driver SDV (e.g., a driver circuit), a data driver DDV (e.g., a driver circuit), and a timing controller T-CON (e.g., a controller circuit). The display panel DP may include a plurality of pixels PX, a plurality of scan lines SL1 to SLm, and a plurality of data lines DL1 to DLn. The subscripts "m" and "n" are natural numbers.

The scan lines SL1 to SLm may extend in the second direction DR2 to come into connection with the pixels PX and the scan driver SDV. The data lines DL1 to DLn may extend in the first direction DR1 to come into connection with the pixels PX and the data driver DDV.

The display panel DP may be applied with a first voltage ELVDD and a second voltage ELVSS having a level lower than that of the first voltage ELVDD. The first voltage ELVDD and the second voltage ELVSS may be applied to the pixels PX.

The timing controller T-CON may receive image signals RGB and a control signal CS from the outside (e.g., system board). The timing controller T-CON may generate image data DATA obtained by converting data formats of the image signals RDG to meet an interface specification of data driver DDV. The timing controller T-CON may provide the data driver DDV with the image data DATA whose data format is converted.

In response to the control signal CS provided externally, the timing controller T-CON may generate and output a first control signal CS1 and a second control signal CS2. The first control signal CS1 may be a scan control signal, and the second control signal CS2 may be a data control signal. The first control signal CS1 may be provided to the scan driver SDV, and the second control signal CS2 may be provided to the data driver DDV.

In response to the first control signal CS1, the scan driver SDV may generate a plurality of scan signals. The scan signals may be applied through the scan lines SL1 to SLm to the pixels PX. In response to the second control signal CS2, the data driver DDV may generate a plurality of data voltages that correspond to the image data DATA. The data voltages may be applied through the data lines DL1 to DLn to the pixels PX.

In response to the scan signals, the data voltages may be provided to the pixels PX. The pixels PX may emit light rays whose brightness correspond to the data voltages, thereby displaying an image.

On each of the pixels PX, a gate-source voltage may be sensed and output as a sensing voltage Vs. The sensing voltage Vs may be provided through the data driver DDV to the timing controller T-CON. The timing controller T-CON may use the sensing voltage Vs to calculate a threshold voltage of a driver transistor in each pixel PX. The calculated threshold voltage may be used to determine a degraded state of a pixel PX. For example, if the calculated threshold for a pixel PX is larger or smaller than a reference voltage or outside a reference voltage range, the timing controller T-CON could conclude that the pixel is in a degraded state.

Based on the degraded state of the pixels PX, the timing controller T-CON may compensate the image data DATA applied to the pixels PX. This operation will be further discussed in detail below.

Figure 3:
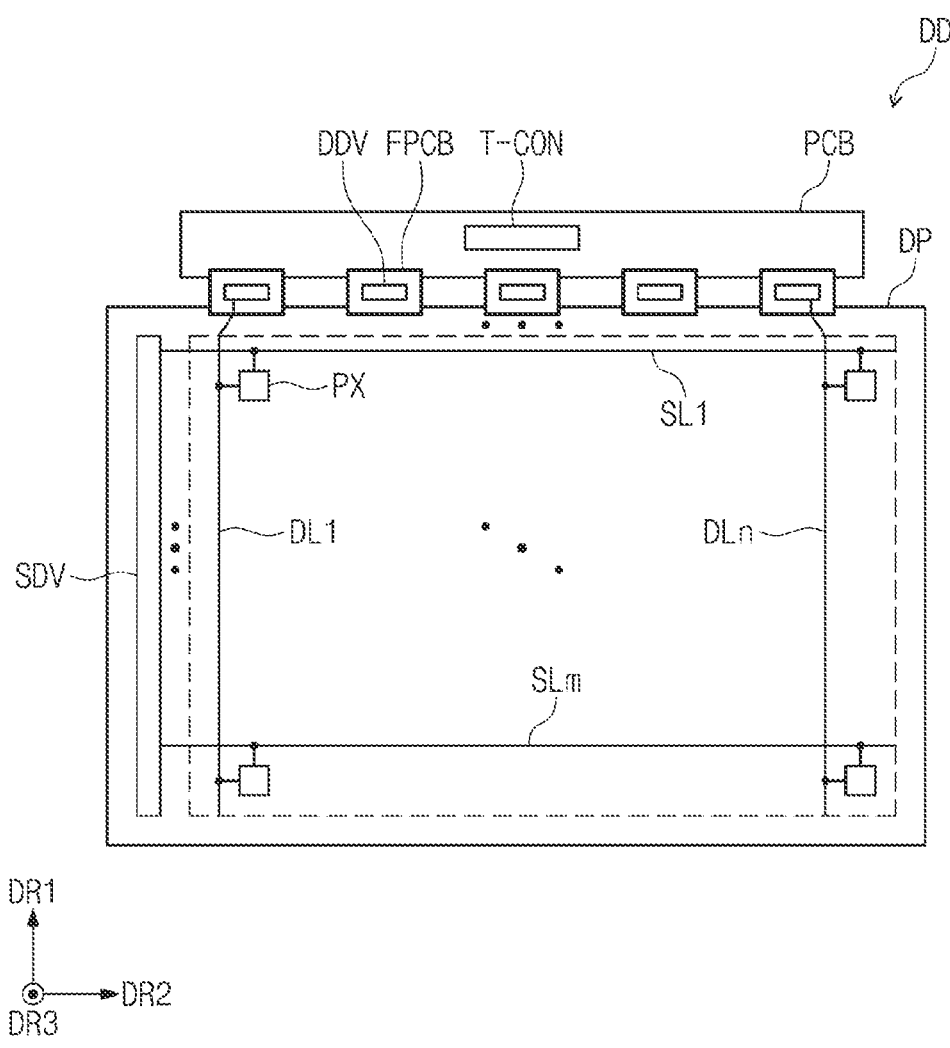
FIG. 3 illustrates a plan view showing a display panel depicted in FIG. 2.

FIG. 3 illustrates a plan view showing the display panel depicted in FIG. 2.

In the embodiment that follows, identical or similar components in FIGS. 2 and 3 will not be discussed below in order to avoid a repetitive description.

Referring to FIG. 3, a display device DD may include a display panel DP, a scan driver SDV, a data driver DDV, a plurality of flexible circuit boards FPCB, a timing controller T-CON, and a printed circuit board PCB.

The display panel DP may include a display area DA and a non-display area NDA that surrounds the display area DA. The display panel DP according to an embodiment of the present invention may be an emissive display panel, but the present invention is not particularly limited thereto. For example, the display panel DP may be an organic light emitting display panel or an inorganic light emitting display panel. An emission layer of the organic light emitting display panel may include an organic light emitting material. An emission layer of the inorganic light emitting display panel may include a quantum-dot or a quantum-rod. The following will describe an example in which an organic light emitting display panel is used as the display panel DP.

The display area DA may include pixels PX disposed thereon. The scan driver SDV may be disposed on the non-display area NDA adjacent to one of shorter sides of the display panel DP. The data driver DDV may be provided in plural. The data drivers DDV may be disposed adjacent to a top side of the display panel DP, where the top side may to refer to one of the longer sides of the display panel DP.

The printed circuit board PCB may be disposed adjacent to the top side of the display panel DP. The printed circuit board PCB may be connected through the flexible circuit boards FPCB to the display board DP. The flexible circuit boards FPCB may be connected to the printed circuit board PCB and the top side of the display panel DP. The data drivers DDV may be manufactured in the form of an integrated circuit chips mounted on the flexible circuit boards FPCB.

The data lines DL1 to DLn may extend to the flexible circuit boards FPCB to come into connection with the data drivers DDV. It is shown by way of example that two data lines DL1 and DLn are disposed on leftmost and rightmost locations and connected to the data drivers DDV, but substantially a plurality of data lines may be connected to each of the data drivers DDV. The printed circuit board PCB may be mounted thereon with the timing controller T-CON manufactured in the form of an integrated circuit chip.

Figure 4:
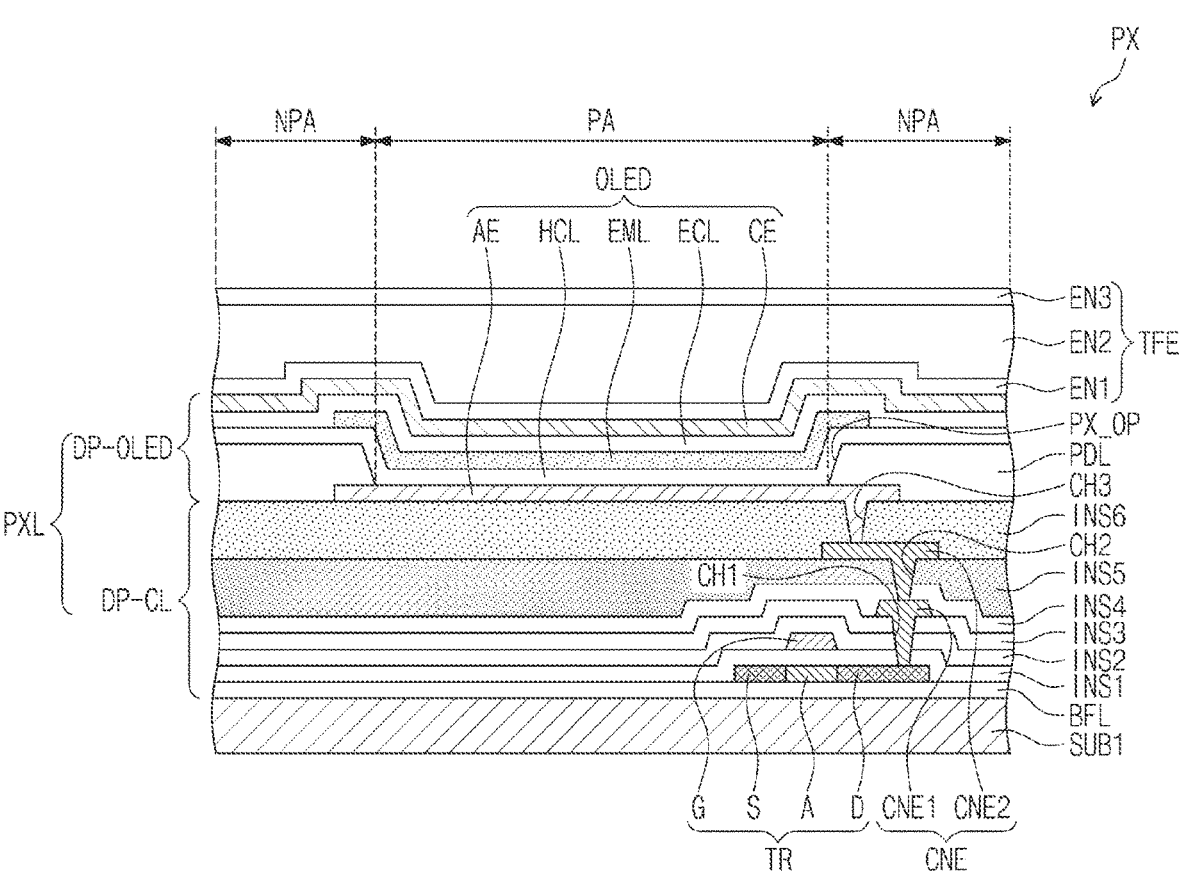
FIG. 4 illustrates a cross-sectional view showing an example of one pixel depicted in FIG. 3.

FIG. 4 illustrates a cross-sectional view showing an example of one pixel depicted in FIG. 3.

Referring to FIG. 4, the pixel PX may include a transistor TR and a light emitting element OLED. The light emitting element OLED may include a first electrode (or anode) AE, a second electrode (or cathode) CE, a hole control layer HCL, an electron control layer ECL, and an emission layer EML. The transistor TR and the light emitting element OLED may be disposed on a first substrate SUB1.

The pixel PX may include an emission area PA and a non-emission area NPA around the emission area PA. The light emitting element OLED may be disposed on the emission area PA.

A buffer layer BFL may be disposed on the first substrate SUB1, and the buffer layer BFL may be an inorganic layer. A semiconductor pattern may be disposed on the buffer layer BFL. The semiconductor pattern may include polysilicon, amorphous silicon, or metal oxide.

The semiconductor pattern may be doped with n-type or p-type impurities. In an embodiment, the semiconductor pattern includes a heavily doped region and a lightly doped region. The heavily doped region may be larger than the lightly doped region, and may substantially serve as one of source and drain electrodes of the transistor TR. The lightly doped region may substantially correspond to an active (or channel) of the transistor TR.

The transistor TR may include a source S (e.g., a source region), an active A (e.g., an active region), and a drain D (e.g., a drain region) that are formed of the semiconductor pattern. A first dielectric layer INS1 may be disposed on the semiconductor pattern. The first dielectric layer INS1 may be provided thereon with a gate G of the transistor TR. A second dielectric layer INS2 may be disposed on the gate G. A third dielectric layer INS3 may be disposed on the second dielectric layer INS2.

A connection electrode CNE may connect the transistor TR and the light emitting element OLED to each other. The connection electrode CNE may include a first connection electrode CNE1 and a second connection electrode CNE2. The first connection electrode CNE1 may be disposed on the third dielectric layer INS3, and may be connected to the drain D through a first contact hole CH1 defined in the first to third dielectric layers INS1 to INS3.

A fourth dielectric layer INS4 may be disposed on the first connection electrode CNE1. A fifth dielectric layer INS5 may be disposed on the fourth dielectric layer INS4. The second connection electrode CNE2 may be disposed on the fifth dielectric layer INS5. The second connection electrode CNE2 may be connected to the first connection electrode CNE1 through a second contact hole CH2 defined in the fourth and fifth dielectric layers INS4 and INS5.

A sixth dielectric layer INS6 may be disposed on the second connection electrode CNE2. A circuit element layer DP-CL may be defined to include layers from the buffer layer BFL to the sixth dielectric layer INS6. The first to sixth dielectric layers INS1 to INS6 may be inorganic or organic layers.

The first electrode AE may be disposed on the sixth dielectric layer INS6. The first electrode AE may be connected to the second connection electrode CNE2 through a third contact hole CH3 defined in the sixth dielectric layer INS6. The first electrode AE and the sixth dielectric layer INS6 may be provided thereon with a pixel definition layer PDL having an opening PX_OP to expose a certain portion of the first electrode AE.

The hole control layer HCL may be disposed on the first electrode AE and the pixel definition layer PDL. The hole control layer HCL may include a hole transport layer and a hole injection layer.

The emission layer EML may be disposed on the hole control layer HCL. The emission layer EML may be disposed on a location that corresponds to the opening PX_OP. The emission layer EML may include one or more of an organic material and an inorganic material. The emission layer EML may produce a blue light.

The electron control layer ECL may be disposed on the emission layer EML and the hole control layer HCL. The electron control layer ECL may include an electron transport layer and an electron injection layer. The hole control layer HCL and the electron control layer ECL may be disposed in common on the emission area PA and the non-emission area NPA.

The second electrode CE may be disposed on the electron control layer ECL. The second electrode CE may be disposed in common on the pixels PX. A section where the light emitting element OLED is disposed may be defined as a display element layer DP-OLED. A pixel layer PXL may be defined to include the circuit element layer DP-CL and the display element layer DP-OLED.

A thin-film encapsulation layer TFE may be disposed on the second electrode CE to cover the pixel PX. The thin-film encapsulation layer TFE may include a first encapsulation layer EN1 disposed on the second electrode CE, a second encapsulation layer EN2 disposed on the first encapsulation layer EN1, and a third encapsulation layer EN3 disposed on the second encapsulation layer EN2. The first and third encapsulation layers EN1 and EN3 may include an inorganic dielectric layer, and may protect the pixel PX against one or more of moisture and oxygen. The second encapsulation layer EN2 may include an organic dielectric layer, and may protect the pixel PX against foreign substances such as dust particles.

A first voltage ELVDD may be applied through the transistor TR to the first electrode AE, and a second voltage ELVSS may be applied through the transistor TR to the second electrode CE. In an embodiment, the first voltage ELVDD is larger than the second voltage ELVSS. Holes and electrons injected into the emission layer EML may combine with each other to produce excitons, and the light emitting element OLED may emit light as the excitons return to a ground state.

Figure 5:
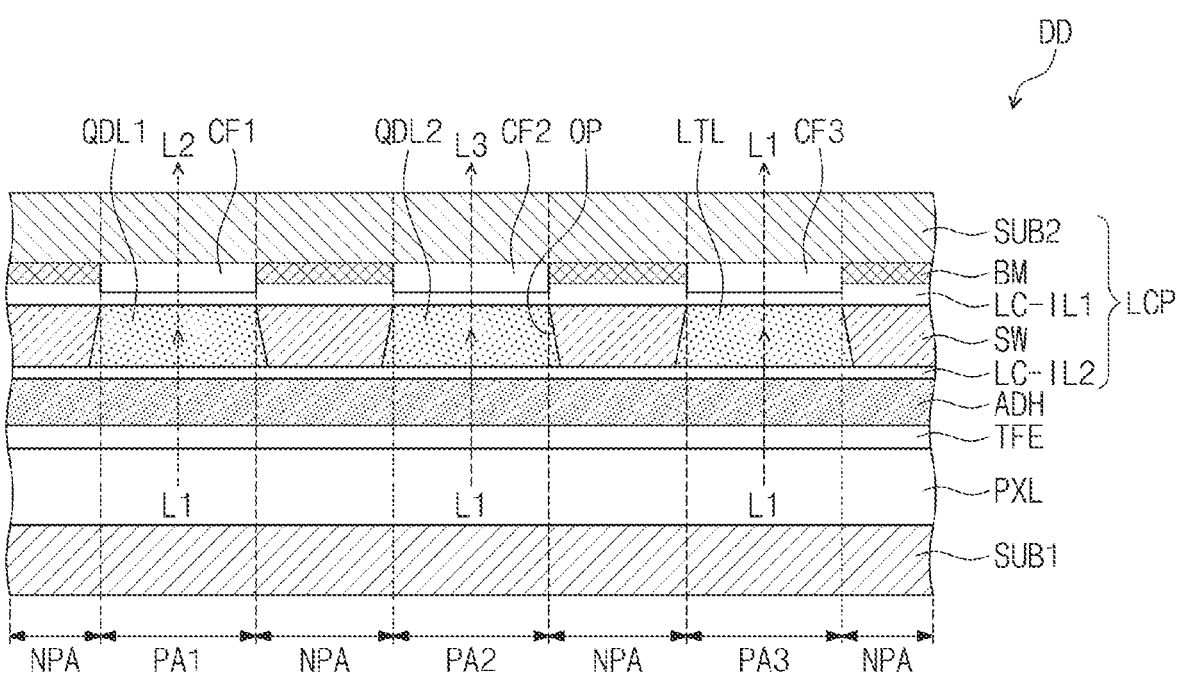
FIG. 5 illustrates a cross-sectional view showing an example of a light conversion part disposed on a pixel layer depicted in FIG. 4.

FIG. 5 illustrates a cross-sectional view showing an example of a photoelectric conversion part disposed on a pixel layer depicted in FIG. 4.

FIG. 5 depicts by way of example first, second, and third emission areas PA1, PA2, and PA3, and the emission area PA shown in FIG. 5 may be one of the first, second, and third emission areas PA1, PA2, and PA3. In addition, for convenience of description, FIG. 5 omits illustration of cross-sectional structures of the transistor TR and the light emitting element OLED shown in FIG. 4, and in FIG. 5, the pixel layer PXL is illustrated as a single layer.

Referring to FIG. 5, the display device DD may include a light conversion part LCP disposed on the thin-film encapsulation layer TFE. The light conversion part LCP may be attached through an adhesion layer ADH to the thin-film encapsulation layer TFE.

A section between the first, second, and third emission areas PA1, PA2, and PA3 may be defined as the non-emission area NPA. The first, second, and third emission areas PA1, PA2, and PA3 may produce a first light L1. For example, the first light L1 may be a blue light.

The light conversion part LCP may include a second substrate SUB2, first and second quantum-dot layers QDL1 and QDL2, a light transmission layer LTL, first, second, and third color filters CF1, CF2, and CF3, a black matrix BM, a partition layer SW, and first and second dielectric layers LC-IL1 and LC-IL2.

The first, second, and third color filters CF1, CF2, and CF3 and the black matrix BM may be disposed below the second substrate SUB2. The first, second, and third color filters CF1, CF2, and CF3 may overlap the first, second, and third emission areas PA1, PA2, and PA3. The black matrix BM may overlap the non-emission area NPA.

The first color filter CF1 may overlap the first emission area PA1, the second color filter CF2 may overlap the second emission area PA2, and the third color filter CF3 may overlap the third emission area PA3. The first color filter CF1 may include a red color filter. The second color filter CF2 may include a green color filter. The third color filter CF3 may include a blue color filter. While the color filters are described as including red, green and blue color filters, the inventive concept is not limited thereto as color filters of colors other than red, green and blue may be used.

The first dielectric layer LC-IL1 may be disposed below the first, second, and third color filters CF1, CF2, and CF3 and the black matrix BM. The partition layer SW may be disposed below the first dielectric layer LC-ILL The partition layer SW may have openings OP that are defined to receive the first and second quantum-dot layers QDL1 and QDL2 and the light transmission layer LTL. The openings OP may overlap the first, second, and third emission areas PA1, PA2, and PA3. The partition layer SW may overlap the non-emission area NPA. The partition layer SW may have a black color.

The first dielectric layer LC-IL1 may be provided thereunder with the first and second quantum-dot layers QDL1 and QDL2 and the light transmission layer LTL. The first and second quantum-dot layers QDL1 and QDL2 and the light transmission layer LTL may be disposed in the openings OP.

The first and second quantum-dot layers QDL1 and QDL2 and the light transmission layer LTL may overlap the first, second, and third emission areas PA1, PA2, and PA3. The first quantum-dot layer QDL1 may overlap the first emission area PA1, the second quantum-dot layer QDL2 may overlap the second emission area PA2, and the light transmission layer LTL may overlap the third emission area PA3.

The first light L1 generated from the first, second, and third emission areas PA1, PA2, and PA3 may be provided to the first and second quantum-dot layers QDL1 and QDL2 and the light transmission layer LTL. The first light L1 generated from the first emission area PA1 may be provided to the first quantum-dot layer QDL1, and the first light L1 generated from the second emission area PA2 may be provided to the second quantum-dot layer QDL2. The first light L1 generated from the third emission area PA3 may be provided to the light transmission layer LTL.

The first quantum-dot layer QDL1 may convert the first light L1 into a second light L2. The second quantum-dot layer QDL1 may convert the first light L1 into a third light L3. For example, the second light L2 may be a red light, and the third light L3 may be a green light. The first quantum-dot layer QDL1 may include first quantum dots (not shown), and the second quantum-dot layer QDL2 may include second quantum dots (not shown). The light transmission layer LTL may include light scattering particles (not shown) for light scattering.

The first quantum dots may convert the first light L1 having a blue wavelength range into the second light L2 having a red wavelength range. The second quantum dots may convert the first light L1 having a blue wavelength range into the third light L3 having a green wavelength range. The first quantum dots and the second quantum dots may scatter the second light L2 and the third light L3. The light transmission layer LTL may be transparent to the first light L1 without performing a light conversion operation. The light transmission layer LTL may use light scattering particles to scatter the first light L1, thereby emitting light.

The first quantum-dot layer QDL1 may emit the second light L2, the second quantum-dot layer QDL2 may emit the third light L3, and the light transmission layer LTL may emit the first light L1. Therefore, a certain image may be displayed by the second light L2, the third light L3, and the first light L1 that represent red, green, and blue colors.

A portion of the first light L1 may penetrate the first quantum-dot layer QDL1 without being optically converted by the first quantum dots, thereby being provided to the first color filter CF1. For example, the first light L1 may be present which is not in contact with the first quantum dots and is not converted into the second light L2. The first color filter CF1 may block colors other than a color (e.g., red). The first light L1 which is not being converted in the first quantum-dot layer QDL1 may be blocked by the first color filter CF1 having a red color filter, and thus may not be emitted upwardly.

A portion of the first light L1 may penetrate the second quantum-dot layer QDL2 without being optically converted by the second quantum dots, thereby being provided to the second color filter CF2. For example, the first light L1 may be present which is not in contact with the second quantum dots and is not converted into the third light L3. The first color filter CF1 may block colors other than a color (e.g., green). The first light L1 which is not being converted in the second quantum-dot layer QDL2 may be blocked by the second color filter CF2 having a green color filter, and thus may not be emitted upwardly.

The display device DD may be provided with external light. When a user is provided again with external light that travels toward and reflects from the display panel DP, like a mirror effect, the external light may be visible to the user.

The first, second, and third color filters CF1, CF2, and CF3 may prevent reflection of external light. For example, the first, second, and third color filters CF1, CF2, and CF3 may filter the external light into red, green, and blue colors. In other words, the first, second, and third color filters CF1, CF2, and CF3 may filter the external light into colors the same as those of the second light L2, the third light L3, and the first light L1, respectively. In this case, the external light may be invisible to users.

Figure 6:
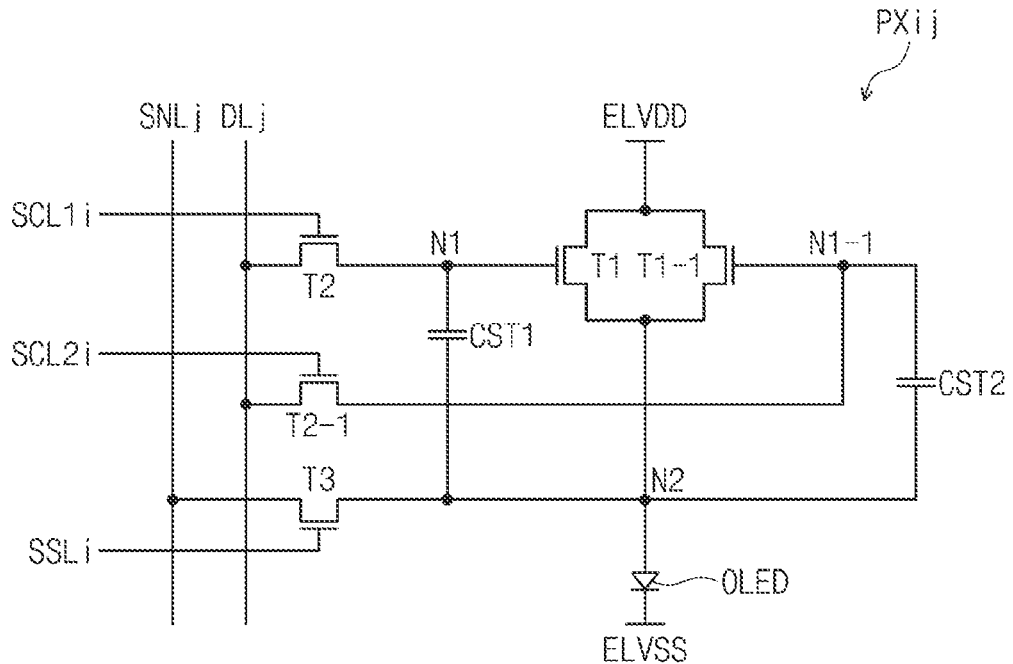
FIG. 6 illustrates an equivalent circuit diagram showing one pixel depicted in FIG. 3.

FIG. 6 illustrates an equivalent circuit diagram showing one pixel depicted in FIG. 3 according to an embodiment of the inventive concept.

Referring to FIG. 6, a pixel PXij may be connected to an $i^{th}$ first scan line SCL1$i$, an second scan line SCL2$i$, an $j^{th}$ data line DLj, an $i^{th}$ sensing scan line SSLi, and a $j^{th}$ sensing line SNLj. The subscripts "i" and "j" are natural numbers.

The scan lines SL1 to SLm may include the $i^{th}$ first scan line SCL1$i$, the $i^{th}$ second scan line SCL2$i$, and the $i^{th}$ sensing scan line SSLi that are shown in FIG. 6. The data lines DL1 to DLm may include the $j^{th}$ data line DLj and the $j^{th}$ sensing line SNLj that are shown in FIG. 6.

The pixel PXij may include a first transistor T1, a first-first transistor T1-1, a second transistor T2, a second-first transistor T2-1, a first capacitor CST1, a second capacitor CST2, a third transistor T3, and a light emitting element OLED. The transistor TR shown in FIG. 4 may be either the first transistor T1 or the first-first transistor T1-1.

The first transistor T1 and the first-first transistor T1-1 may be referred to as driver transistors. The second transistor T2 and the second-first transistor T2-1 may be referred to as switching transistors. The third transistor T3 may be referred to as a sensing transistor.

The transistors T1, T1-1, T2, T2-1, and T3 may be NMOS transistors or PMOS transistors. The transistors T1, T1-1, T2, T2-1, and T3 may include source, drain, and gate electrodes, respectively. For convenience in this description below, one of the source and drain electrodes is referred to as a first electrode, and the other of the source and drain electrodes is referred to as a second electrode. In addition, the gate electrode is referred to as a control electrode.

The first transistor T1 may include a control electrode connected to a first node N1, a first electrode that receives a first voltage ELVDD, and a second electrode connected to a second node N2. In accordance with a gate-source voltage, the first transistor T1 may control an amount of current that flows through the light emitting element OLED.

The first-first transistor T1-1 may include a control electrode connected to a first-first node N1-1, a first electrode that receives the first voltage ELVDD, and a second electrode connected to the second node N2. In accordance with a gate-source voltage, the first-first transistor T1-1 may control an amount of current that flows through the light emitting element OLED.

The second transistor T2 may include a first electrode connected to the $j^{th}$ data line DLj, a second electrode connected to the first node N1, and a control electrode connected to the $i^{th}$ first scan line SCL1$i$. The second transistor T2 may be turned on by a first scan signal applied from the $i^{th}$ first scan line SCL1$i$ to provide the first node N1 with a data voltage provided from the $j^{th}$ data line DLj. The first capacitor CST1 may charge the data voltage.

The second-first transistor T2-1 may include a first electrode connected to the $j^{th}$ data line DLj, a second electrode connected to a first-first node N1-1, and a control electrode connected to the $i^{th}$ second scan line SCL2$i$. The second-first transistor T2-1 may be turned on by a second scan signal applied from the $i^{th}$ second scan line SCL2$i$ to provide the first-first node N1-1 with a data voltage provided from the $j^{th}$ data line DLj. The second capacitor CST2 may charge the data voltage.

The first capacitor CST1 may be connected to the first node N1 and the second node N2. The first capacitor CST1 may include a first electrode connected to the first node N1 and a second electrode connected to the second node N2.

The second capacitor CST2 may be connected to the first-first node N1-1 and the second node N2. The second capacitor CST2 may include a first electrode connected to the first-first node N1-1 and a second electrode connected to the second node N2.

The third transistor T3 may include a first electrode connected to the $j^{th}$ sensing line SNLj, a second electrode connected to the second node N2, and a control electrode connected to the $i^{th}$ sensing scan line SSLi.

The light emitting element OLED may include an anode connected to the second node N2 and a cathode that receives a second voltage ELVSS. The light emitting element OLED may generate light that corresponds to an amount of current provided from the first transistor T1.

Figure 7:
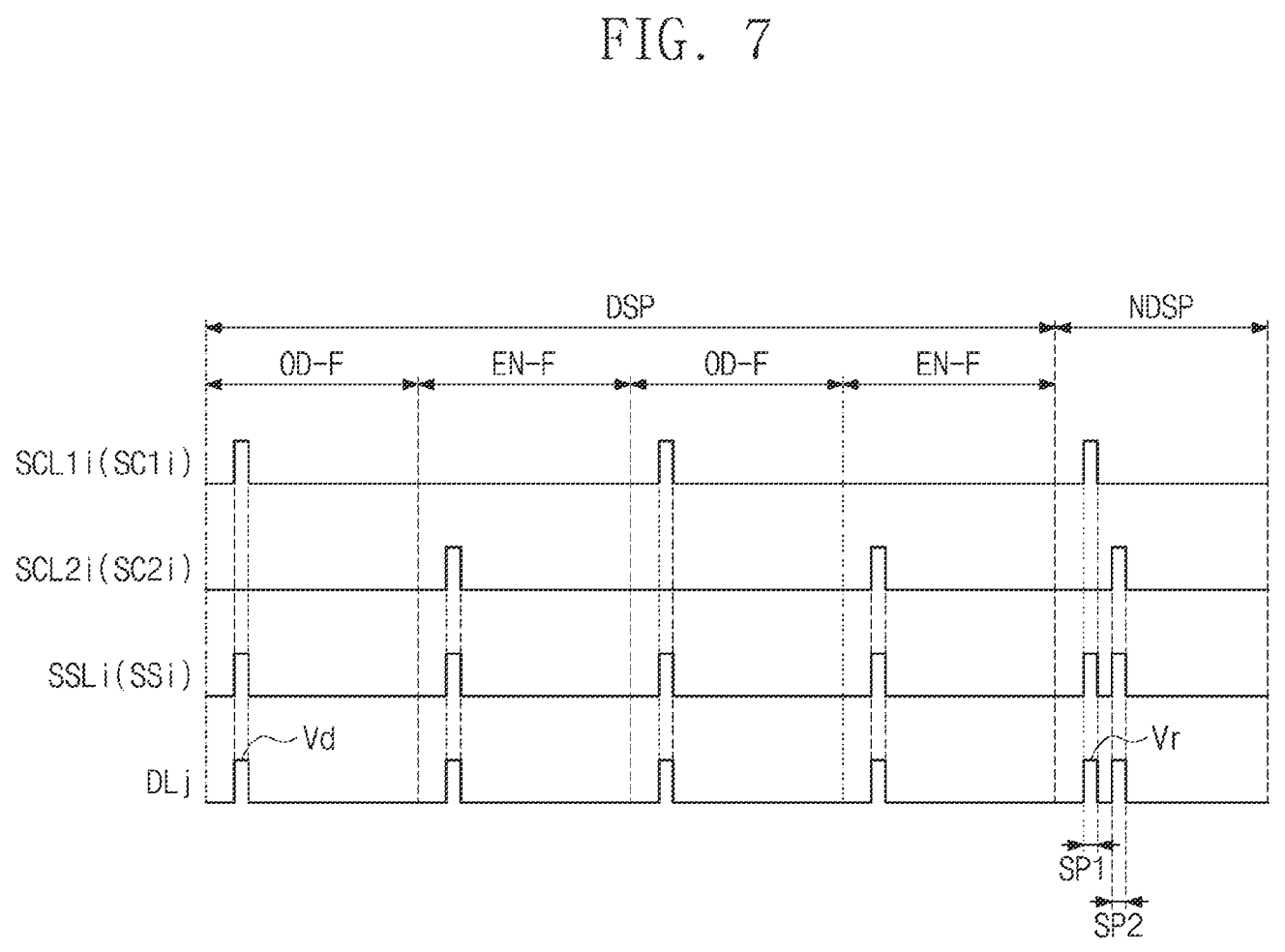
Figure 8:
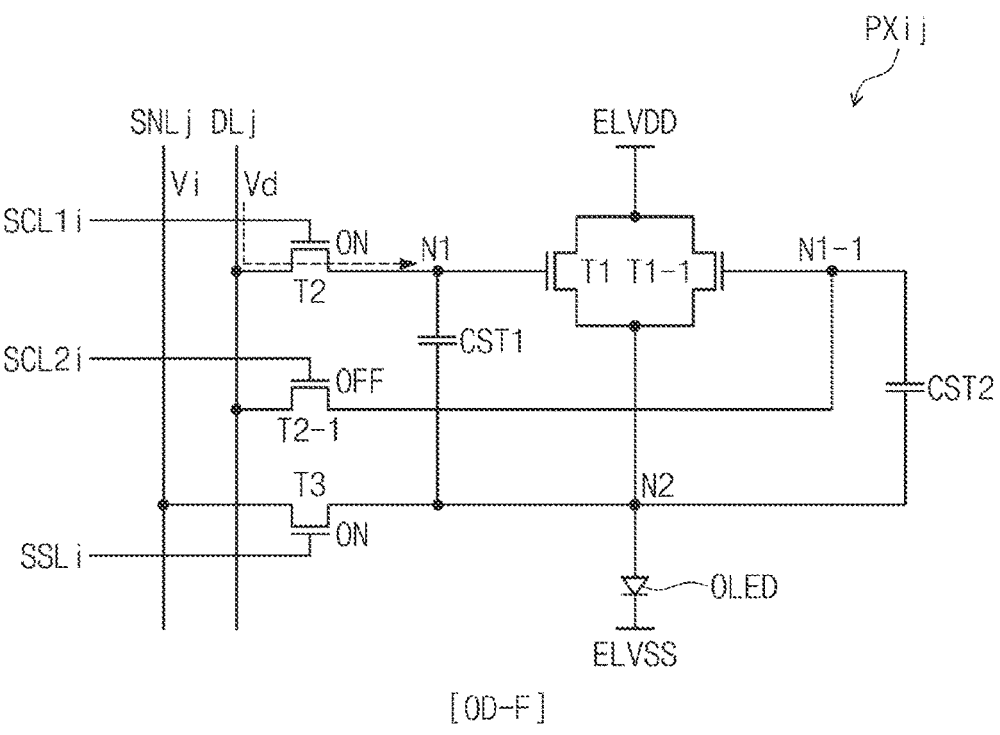
FIG. 8 illustrates an equivalent circuit diagram showing an operation during a first frame of a display period depicted in FIG. 7.
Figure 9:
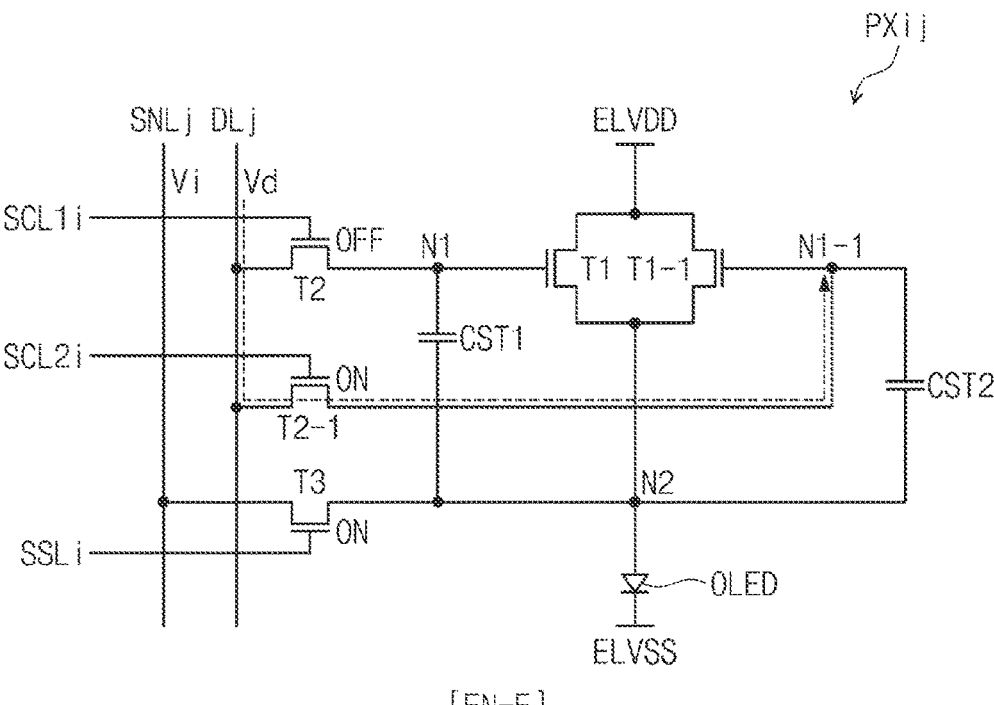
FIG. 9 illustrates an equivalent circuit diagram showing an operation during a second frame of a display period depicted in FIG. 7.

FIG. 7 illustrates a timing diagram of signals for driving a pixel depicted in FIG. 6 according to an embodiment of the inventive concept. FIG. 8 illustrates an equivalent circuit diagram showing an operation during a first frame of a display period depicted in FIG. 7. FIG. 9 illustrates an equivalent circuit diagram showing an operation during a second frame of a display period depicted in FIG. 7.

Referring to FIGS. 6 and 7, the display panel DP may operate in a display period DSP and a non-display period NDSP. In the display period DSP, the display panel DP displays an image, and in the non-display period NDSP, the display panel DP does not display an image. For example, in the non-display period NDSP, the display panel DP may operate in a black mode where a screen of the display panel DP is observable to a viewer as being all black or very dark.

The display period DSP may include a plurality of first frames OD-F and a plurality of second frames EN-F. The first frame OD-F and its next second frame EN-F may be performed repeatedly. The first frames OD-F may be odd-numbered frames, and the second frames EN-F may be even-numbered frames.

The following will discuss an operation of the pixel PXij in whose configuration languages "$i^{th}$" and "$j^{th}$" are omitted. A first scan signal SC1$i$ is applied to the first scan line SCL1$i$, and a second scan signal SC2$i$ is applied to the second scan line SCL2$i$. A sensing scan signal SSi is applied to the sensing scan line SSLi.

The first scan signal SC1$i$ is applied through the first scan line SCL1$i$ to the second transistor T2. The second scan signal SC2$i$ is applied through the second scan line SCL2$i$ to the second-first transistor T2-1. The sensing scan signal SSi is applied through the sensing scan line SSLi to the third transistor T3. A data voltage Vd and a reference voltage Vr may be applied to the data line DLj.

In the first frames OD-F, the first scan signal SC1$i$ may be applied to the first scan line SCL1$i$. In the second frames EN-F, the second scan signal SC2$i$ may be applied to the second scan line SCL2$i$. In the first frames OD-F and the second frames EN-F, the sensing scan signal SSi may be applied to the sensing scan line SSLi.

In an embodiment, in the display period DSP, the sensing signal SSi is applied to the sensing scan line SSLi with the same timing as the application of the first scan signal SC1$i$ and the second scan signal SC2$i$. For example, when the first scan signal SC1$i$ is applied to the first scan line SCL1$i$, the sensing scan signal SSi may be applied to the sensing scan line SSLi. In addition, when the second scan signal SC2$i$ is applied to the second scan line SCL2$i$, the sensing scan signal SSi may be applied to the sensing scan line SSLi.

In an embodiment, the data voltage Vd is applied to the data line DLj in the first frames OD-F and the second frames EN-F. In an embodiment, the reference voltage Vr is applied to the data line DLj in the non-display period NDSP.

The non-display period NDSP may include a first sensing duration SP1 and a second sensing duration SP2 next to the first sensing duration SP1. In the first sensing duration SP1, the first scan signal SC1$i$ may be applied to the first scan line SCL1$i$. In the second sensing duration SP2, the second scan signal SC2$i$ may be applied to the second scan line SCL2$i$.

In the first sensing duration SP1 and the second sensing duration SP2, the sensing scan signal SSi may be applied to the sensing scan line SSLi. In an embodiment, in the non-display period NDSP, the sensing signal SSi is applied to the sensing scan line SSLi with the same timing as the application of the first scan signal SC1$i$ and the second scan signal SC2$i$.

In the following description, an activated signal may be a high-level signal, and an inactivated signal may be a low-level signal.

Referring to FIGS. 7 and 8, in the first frame OD-F, the second transistor T2 is provided with an activated first scan signal SC1$i$, and is turned on in response to the activated first scan signal SC1$i$. In the first frame OD-F, the third transistor T3 is provided with an activated sensing scan signal SSi, and is turned on in response to the activated sensing scan signal SSi. In the first frame OD-F, the second transistor T2 and the third transistor T3 may be turned on together.

In the first frame OD-F, the second-first transistor T2-1 is turned off by receiving an inactivated second scan signal SC2$i$.

During a program section of the first frame OD-F, the data voltage Vd may be applied to the first node N1 through the data line DLj and the turned-on second transistor T2. During the program section of the first frame OD-F, an initialization voltage Vi may be applied to the second node N2 through the sensing line SNLj and the turned-on third transistor T3.

A voltage between the first node N1 and the second node N2 may be set as a difference between the data voltage Vd and the initialization voltage Vi. The first capacitor CST1 may be charged with electric charges that correspond to the difference between the data voltage Vd and the initialization voltage Vi. During the program section, the voltage between the first node N1 and the second node N2 may be set to match a required pixel current. The voltage between the first node N1 and the second node N2 may be a gate-source voltage of the first transistor T1, and the first transistor T1 may be turned on. For example, the voltage between the first node N1 and the second node N2 may be sufficient to turn on the first transistor T1.

In the first frame OD-F, during a light emitting section after the program section, the first scan signal SC1$i$ and the sensing scan signal SSi may be inactivated to turn off the second transistor T2 and the third transistor T3. The first capacitor CST1 may maintain the voltage between the first node N1 and the second node N2. For example, the first capacitor CST1 may maintain the voltage between the first node N1 and the second node N2 for a period of time after the second transistor T2 and the third transistor T3 are turned off.

Because the voltage between the first node N1 and the second node N2 is greater than a threshold voltage of the first transistor T1, a pixel current may flow through the first transistor T1 during the light emitting section. The pixel current may flow in accordance with the first voltage ELVDD. In this case, during the light emitting section, an electrical potential of the first node N1 and an electrical potential of the second node N2 may be boosted while maintaining the voltage between the first node N1 and the second node N2. When the electrical potential of the second node N2 is boosted to a level of operation of the light emitting element OLED, the light emitting element OLED may emit light.

Because the second-first transistor T2-1 is in a turn-off state, the data voltage Vd is not applied to the first-first node N1-1. Therefore, in the first frame OD-F, the first-first transistor T1-1 is in a turn-off state. In an embodiment, the first-first transistor T1-1 in a turn-off state has a gate-source voltage less than about 0 V.

The first-first transistor T1-1 may be provided with light generated from the light emitting element OLED. When the first-first transistor T1-1 has a gate-source voltage less than about 0 V, and when light is irradiated on the first-first transistor T1-1, a voltage-current curve of the first-first transistor T1-1 may be shifted leftward (see FIG. 10). This phenomenon may be referred to as negative bias illumination stress (NBIS).

Referring to FIGS. 7 and 9, in the second frame EN-F, the second-first transistor T2-1 is turned on by receiving an activated second scan signal SC2i, and the third transistor T3 is turned on by receiving an activated sensing scan signal SSi. In the second frame EN-F, the second-first transistor T2-1 and the third transistor T3 may be turned on together. In the second frame EN-F, the second transistor T2 may be turned off by receiving an inactivated first scan signal SC1i.

During a program section of the second frame EN-F, the data voltage Vd may be applied to the first-first node N1-1 through the data line DLj and the second-first transistor T2-1, and the initialization voltage Vi may be applied to the second node N2 through the sensing line SNLj and the third transistor T3.

A voltage between the first-first node N1-1 and the second node N2 may be set as a difference between the data voltage Vd and the initialization voltage Vi. The second capacitor CST2 may be charged with electric charges that correspond to the difference between the data voltage Vd and the initialization voltage Vi. During a program section, the voltage between the first-first node N1-1 and the second node N2 may be set to match a required pixel current. The voltage between the first-first node N1-1 and the second node N2 may be a gate-source voltage of the first-first transistor T1-1, and the first-first transistor T1-1 may be turned on.

In the second frame EN-F, during a light emitting section after the program section, the second scan signal SC2i and the sensing scan signal SSi are inactivated to turn off the second-first transistor T2-1 and the third transistor T3. The second capacitor CST2 may maintain the voltage between the first-first node N1-1 and the second node N2.

Because the voltage between the first-first node N1-1 and the second node N2 is greater than a threshold voltage of the first-first transistor T1-1, during the light emitting section, a pixel current may flow through the first-first transistor T1-1. The pixel current may flow in accordance with the first voltage ELVDD. In this case, during the light emitting section, an electrical potential of the first-first node N1-1 and an electrical potential of the second node N2 may be boosted while maintaining the voltage between the first-first node N1-1 and the second node N2. When the electrical potential of the second node N2 is boosted to a level of operation of the light emitting element OLED, the light emitting element OLED may emit light.

Because the second transistor T2 is in a turn-off state, the data voltage Vd is not applied to the first node N1. Therefore, in the second frame EN-F, the first transistor T1 is in a turn-off state. In an embodiment, the first transistor T1 in a turn-off state has a gate-source voltage less than about 0 V.

The first transistor T1 may be provided with light generated from the light emitting element OLED. When the first transistor T1 has a gate-source voltage less than about 0 V, and when light is irradiated on the first transistor T1, a voltage-current curve of the first transistor T1 may be shifted leftward (see FIG. 10).

Figure 10:
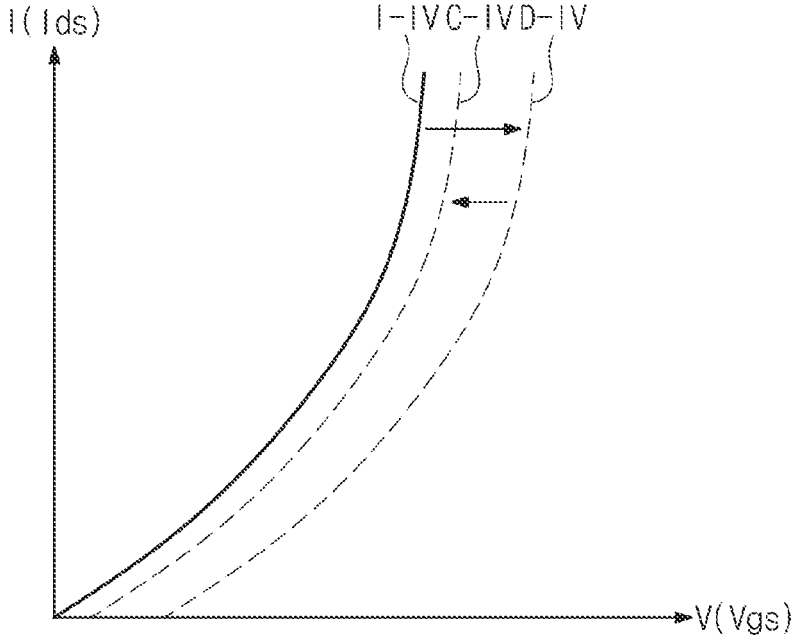
FIG. 10 illustrates a graph showing an example of current-voltage curves that exhibit current-voltage characteristics of first and first-first transistors depicted in FIGS. 8 and 9.

FIG. 10 illustrates a graph showing an example of current-voltage curves that exhibit current-voltage characteristics of first and first-first transistors depicted in FIGS. 8 and 9.

In FIG. 10, a vertical axis denotes current I, and a horizontal axis represents voltage V. Substantially, the current I may express a drain-source current Ids, and the voltage V may indicate a gate-source voltage Vgs.

In FIGS. 8, 9, and 10, an initial current-voltage curve I-IV may exemplarily indicate a current-voltage curve in an initial state of each of the first transistor T1 and the first-first transistor T1-1. For convenience of description, the following will discuss a degraded state of the first transistor T1. When the first transistor T1 operates in the first frame OD-F, the initial current-voltage curve I-IV of the first transistor T1 may be rightward shifted to a degraded current-voltage curve D-IV.

However, as discussed above, because the first transistor T1 has a gate-source voltage less than about 0 V in the second frame EN-F, and because light is irradiated on the first transistor T1 in the second frame EN-F, the degraded current-voltage curve D-IV of the first transistor T1 may be leftward shifted to a compensated current-voltage curve C-IV. For example, a current-voltage curve of the first transistor T1 may be rightward shifted in the first frame OD-F and leftward shifted in the second frame EN-F.

Similar to the current-voltage curve of the first transistor T1, a current-voltage curve of the first-first transistor T1-1 may be rightward shifted in the second frame EN-F and leftward shifted in the first frame OD-F.

In an embodiment of the present invention, a current-voltage curve may be leftward shifted to compensate for a degraded state of each of the first transistor T1 and the first-first transistor T1-1. In this case, there may be a reduction in a compensation amount of a data voltage being applied to the pixel PXij. This operation be will further discussed below in detail with reference to FIG. 13.

Figure 11:
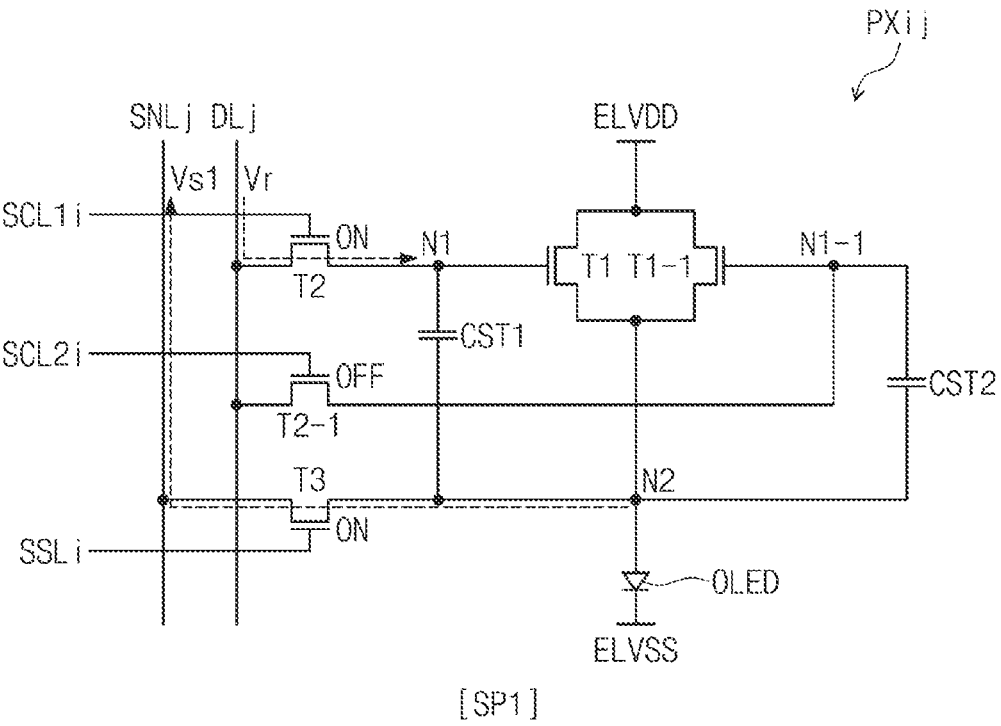
FIG. 11 illustrates an equivalent circuit diagram showing an operation of a first sensing duration in a non-display period depicted in FIG. 7.
Figure 12:
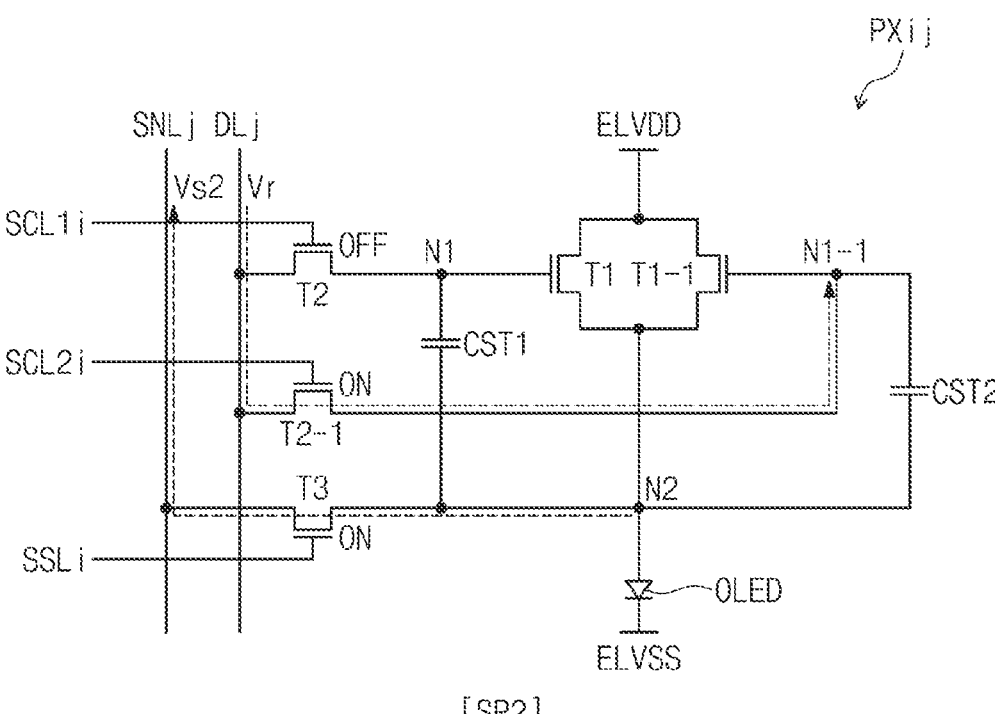
FIG. 12 illustrates an equivalent circuit diagram showing a second sensing duration of a non-display period depicted in FIG. 7.
Figure 13:
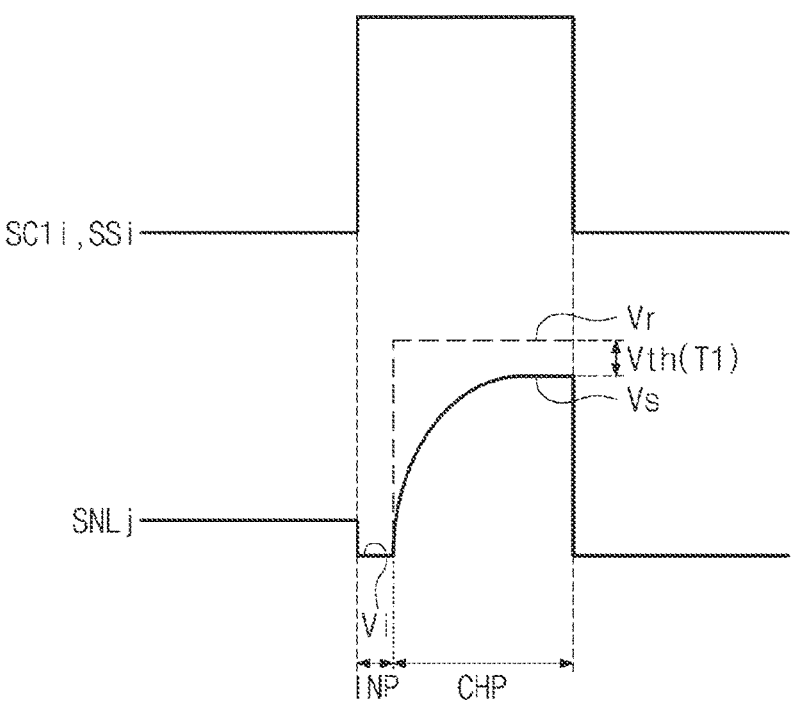
FIG. 13 illustrates a diagram showing an example of first and second sensing voltages depicted in FIGS. 11 and 12.

FIG. 11 illustrates an equivalent circuit diagram showing an operation of a first sensing duration in a non-display period depicted in FIG. 7 according to an embodiment of the invention. FIG. 12 illustrates an equivalent circuit diagram showing an operation of a first sensing duration in a non-display period depicted in FIG. 7 according to an embodiment of the inventive concept. FIG. 13 illustrates a diagram showing an example of first and second sensing voltages depicted in FIGS. 11 and 12.

Referring to FIGS. 7 and 11, during the first sensing duration SP1, an activated first scan signal SC1i is applied to the second transistor T2 and an activated sensing scan signal SSi is applied to the third transistor T3. Therefore, during the first sensing duration SP1, the first scan signal SC1i and the sensing scan signal SSi turn on the second transistor T2 and the third transistor T3.

A reference voltage Vr is applied through the data line DLj to the first node N1 during the first sensing duration SP1. The gate-source voltage of the first transistor T1 may be output through the sensing line SNLj as a first sensing voltage Vs1. The sensing voltage Vs may include or be the first sensing voltage Vs1. The first sensing voltage Vs1 may be sensed in the data driver DDV and then provided to the timing controller T-CON.

Referring to FIGS. 7 and 12, during the second sensing duration SP2, an activated second scan signal SC2$i$ is applied to the second-first transistor T2-1 and an activated sensing scan signal SSi is applied to the third transistor T3. Therefore, during the second sensing duration SP2, the second scan signal SC2$i$ and the sensing scan signal SSi turn on the second-first transistor T2-1 and the third transistor T3.

A reference voltage Vr is applied through the data line DLj to the first-first node N1-1 during the second sensing duration SP2. The gate-source voltage of the first-first transistor T1-1 may be output through the sensing line SNLj as a second sensing voltage Vs2. The sensing voltage Vs may include or be the second sensing voltage Vs2. The second sensing voltage Vs2 may be sensed in the data driver DDV and then provided to the timing controller T-CON. In an embodiment, between the first sensing duration SP1 and the second sensing duration SP2, the second transistor T2, the second-first transistor T2-1, and the third transistor T3 are turned off.

Referring to FIGS. 11 to 13, each of the first scan signal SC1$i$ and the sensing scan signal SSi may have an activation section including an initialization interval INP and a charging interval CHP next to the initialization interval INP.

The initialization voltage Vi may be applied through the sensing line SNLj to the second node N2 during the initialization interval INP, and thus a voltage of the second node N2 may be initialized. Afterwards, during the charging interval CHP, the sensing voltage Vs for each of the first transistor T1 and the first-first transistor T1-1 may be charged and output.

The timing controller T-CON may use the reference voltage Vr and the sensing voltage Vs to calculate a threshold voltage Vth. A difference between the reference voltage Vr and the sensing voltage Vs may be calculated into the threshold voltage Vth.

A threshold voltage may be changed due to degradation of each of the first transistor T1 and the first-first transistor T1-1. The timing controller T-CON may measure the threshold voltage Vth to calculate the degraded state of each of the first transistor T1 and the first-first transistor T1-1. The timing controller T-CON may compensate the image data DATA by calculating the degraded state of each of the first transistor T1 and the first-first transistor T1-1. For example, after the timing controller T-CON determines that one or more of the first transistor T1 and the first-first transistor T1-1 are in a degraded state from the measured threshold voltage, the timing controller T-CON may perform a compensation operation to adjust a value of the image data DATA. For example, the timing controller T-CON could compare a measured threshold voltage with a reference voltage to determine whether the first transistor T1 or the first-first transistor T1-1 is in the degraded state.

Figure 14:
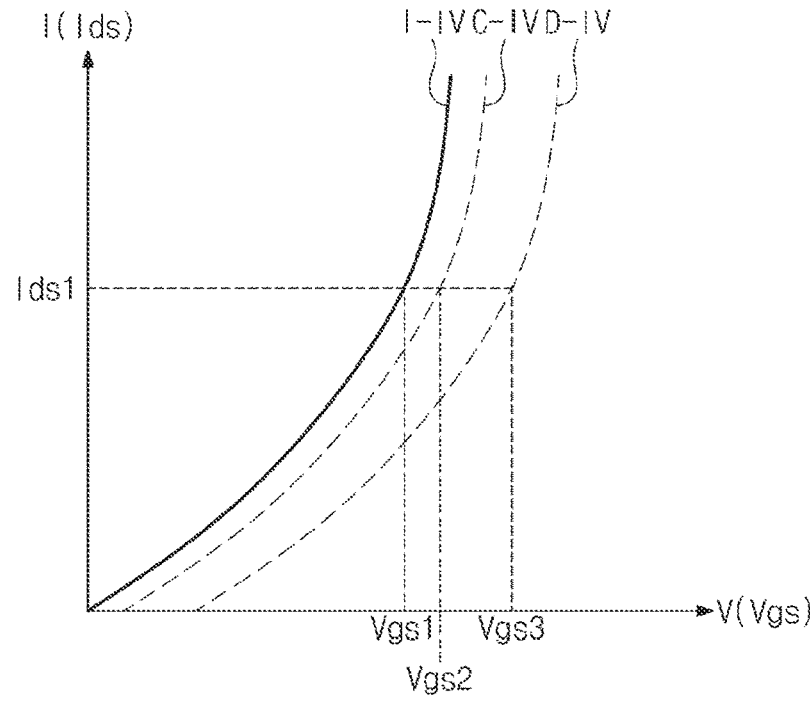
FIG. 14 illustrates a graph showing a compensation operation due to a sensing operation of FIGS. 11 to 13.

FIG. 14 illustrates a graph showing a compensation operation due to a sensing operation of FIGS. 11 to 13.

Referring to FIG. 14, the threshold voltage Vth of each of the first transistor T1 and the first-first transistor T1-1 may be measured to obtain the degraded state of each of the first transistor T1 and the first-first transistor T1-1. The degraded state may be expressed by a current-voltage curve.

As discussed above in FIGS. 8 to 10, it may be possible to compensate the degraded state of each of the first transistor T1 and the first-first transistor T1-1. Therefore, the current-voltage curve of each of the first transistor T1 and the first-first transistor T1-1 may be the compensated current-voltage curve C-IV.

In the initial current-voltage curve I-IV, a first gate-source voltage Vgs1 may be required to allow a first current Ids1 to flow through each of the first transistor T1 and the first-first transistor T1-1. In the compensated current-voltage curve C-IV, a second gate-source voltage Vgs2 may be required to allow the first current Ids1 to flow.

However, in the degraded current-voltage curve D-IV, a third gate-source voltage Vgs3 may be required to allow the first current Ids1 to flow when the first transistor T1 and the first-first transistor T1-1 are operated and degraded.

When each of the first transistor T1 and the first-first transistor T1-1 is compensated for its degraded state, the second gate-source voltage Vgs2 less than the third gate-source voltage Vgs3 may be required to allow the first current Ids1 to flow.

The image data DATA may be converted into the data voltage Vd. The image data DATA may be compensated to compensate the data voltage Vd. In an embodiment, a compensation amount for compensating the data voltage Vd with a voltage that corresponds to the third gate-source voltage Vgs3 is less than that for compensating the data voltage Vd with a voltage that corresponds to the second gate-source voltage Vgs2. Accordingly, in an embodiment of the present invention, there may be a reduction in compensation amount of the image data DATA.

The first transistor T1 and the first-first transistor T1-1 may be continuously operated to increase a compensation amount of the image data DATA. When the compensation amount of the image data DATA oversteps a certain limit, the first transistor T1 and/or the first-first transistor T1-1 may degrade to a point where they no longer become usable.

In an embodiment of the present invention, because the degraded states of the first transistor T1 and the first-first transistor T1-1 are compensated to reduce the compensation amount of the image data DATA, the first transistor T1 and the first-first transistor T1-1 may have increased lifespans.

Figure 15:
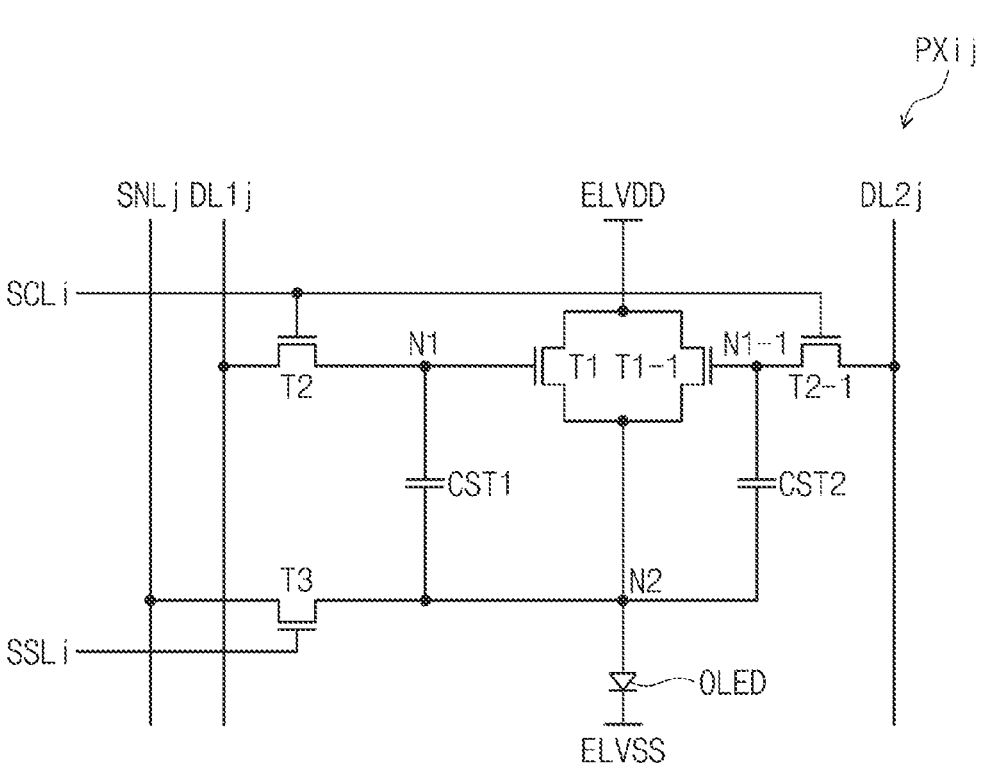
FIG. 15 illustrates an equivalent circuit diagram showing a pixel according to an embodiment of the present invention.

FIG. 15 illustrates an equivalent circuit diagram showing a pixel according to an embodiment of the present invention.

The following will focus on a difference in configuration between a pixel PXij' depicted in FIG. 15 and the pixel PXij depicted in FIG. 6.

Referring to FIG. 15, a pixel PXij' may be connected to an $i^{th}$ scan line SCLi, an $j^{th}$ first data line DL1$j$, an $j^{th}$ second data line DL2$j$, an $i^{th}$ sensing scan line SSLi, and a $j^{th}$ sensing line SNLj. Differently from that of FIG. 6, the pixel PXij' is connected not to an $i^{th}$ second scan line SCL2$i$, but the second data line DL2$j$. The data lines DL1 to DLm may include the $j^{th}$ first data line DL1$j$ and the $j^{th}$ second data line DL2$j$.

The pixel PXij' may include a first transistor T1, a first-first transistor T1-1, a second transistor T2, a second-first transistor T2-1, a first capacitor CST1, a second capacitor CST2, a third transistor T3, and a light emitting element OLED.

The second transistor T2 includes a first electrode connected to the $j^{th}$ first data line DL1$j$, a second electrode connected to a first node N1, and a control electrode connected to the $i^{th}$ scan line SCLi. The second transistor T2 may be turned on by a scan signal applied from the $i^{th}$ scan line SCLi to provide the first node N1 with a first data voltage provided from the $j^{th}$ first data line DL1$j$.

The second-first transistor T2-1 includes a first electrode connected to the $j^{th}$ second data line DL2$j$, a second electrode connected to a first-first node N1-1, and a control electrode connected to the $i^{th}$ scan line SCLi. The second-first transistor T2-1 may be turned on by a scan signal applied from the $i^{th}$ scan line SCLi to provide the first-first node N1-1 with a second data voltage provided from the $j^{th}$ second data line DL2*j*.

Omission will be made to avoid a repetitive description of other components of the pixel PXij' that are substantially the same as those of the pixel PXij depicted in FIG. 6.

Figure 16:
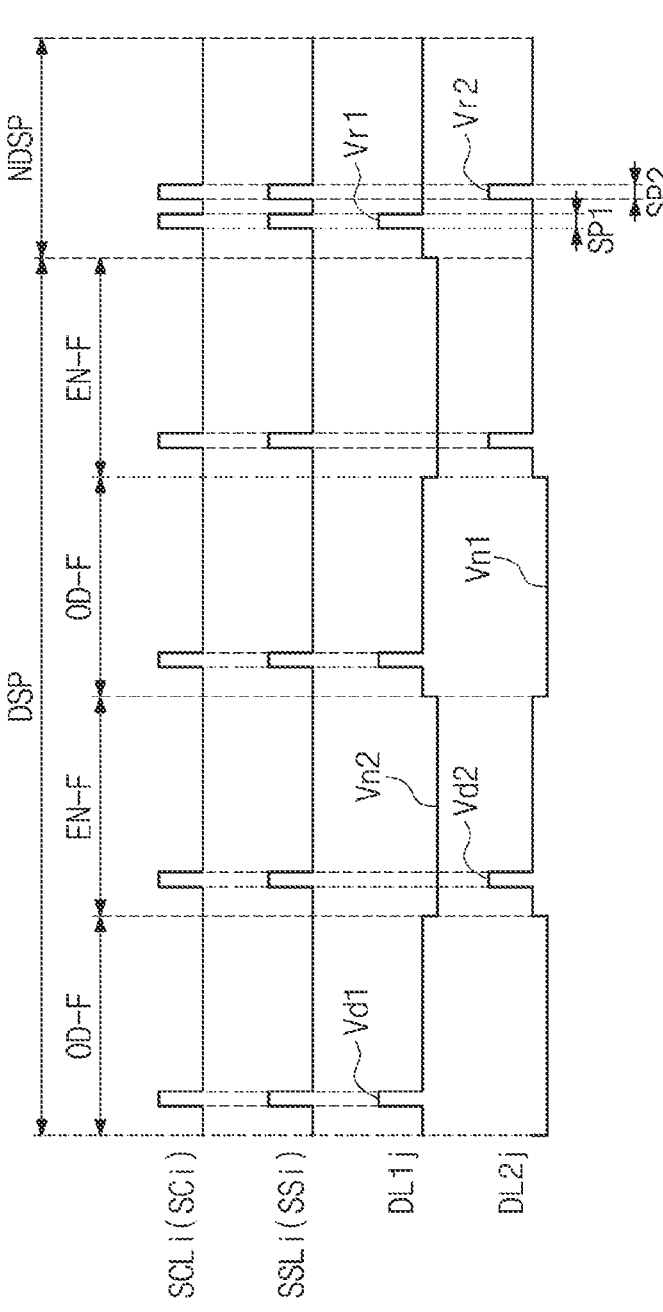
FIG. 16 illustrates a timing diagram of signals for driving a pixel depicted in FIG. 15.
Figure 17:
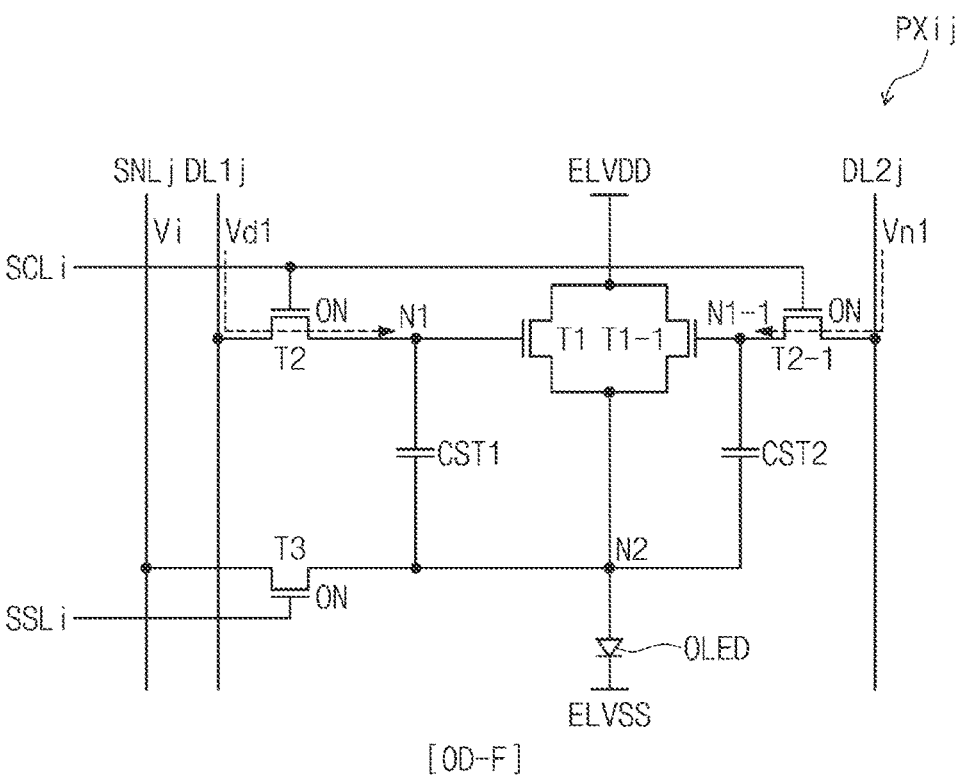
FIG. 17 illustrates an equivalent circuit diagram showing an operation during a second frame of a display period depicted in FIG. 16.
Figure 18:
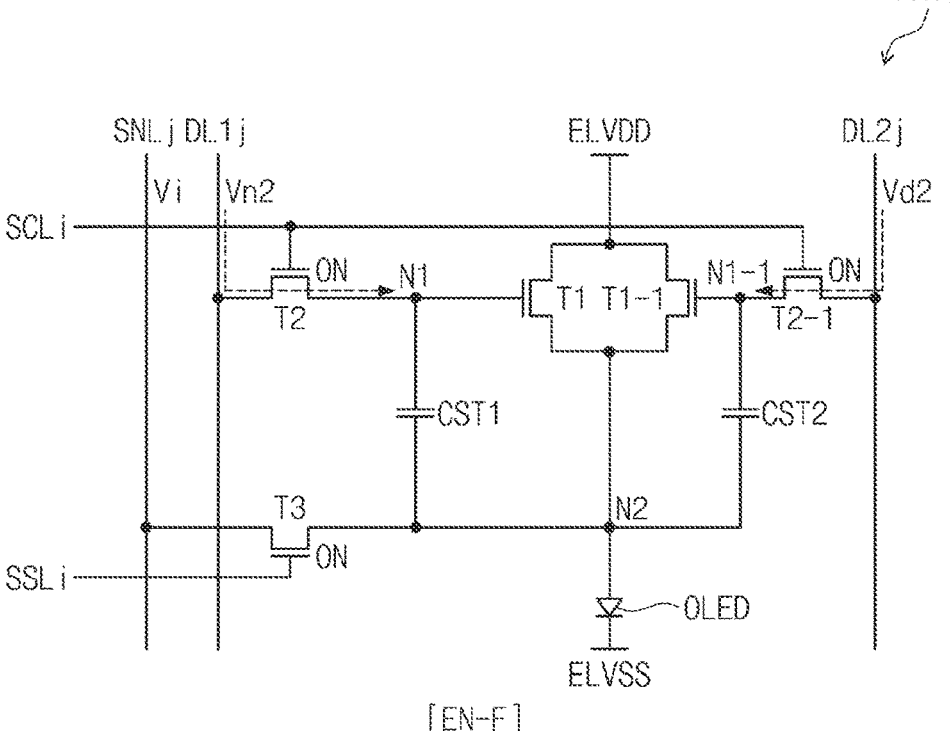
FIG. 18 illustrates an equivalent circuit diagram showing an operation during a second frame of a display period depicted in FIG. 16.

FIG. 16 illustrates a timing diagram of signals for driving a pixel depicted in FIG. 15. FIG. 17 illustrates an equivalent circuit diagram showing an operation during a first frame of a display period depicted in FIG. 16. FIG. 18 illustrates an equivalent circuit diagram showing an operation during a second frame of a display period depicted in FIG. 16 according to an embodiment of the inventive concept.

The following will discuss an operation of the pixel PXij' in which languages "$i^{th}$" and "$j^{th}$" are omitted.

Referring to FIGS. 15 and 16, in the first and second frames OD-F and EN-F, a scan signal SCi is applied through the scan line SCLi to the second transistor T2 and the second-first transistor T2-1. In the first and second frames OD-F and EN-F, a sensing scan signal SSi is applied through the sensing scan line SSLi to the third transistor T3. In an embodiment, the sensing scan signal SSi is applied to the sensing scan line SSLi with the same timing as the application of the scan signal SCi.

In the first frames OD-F, a first data voltage Vd1 is applied to the first data line DL1*j*. In the second frames EN-F, a second data voltage Vd2 is applied to the second data line DL2*j*.

In the first frames OD-F, a first negative voltage Vn1 is applied to the second data line DL2*j*. In the second frames EN-F, a second negative voltage Vn2 is applied to the first data line DL1*j*.

In an embodiment, in the first sensing duration SP1 and the second sensing duration SP2, the scan signal SCi and the sensing scan signal SSi are applied, with the same timing, to the second transistor T2 and the second-first transistor T2-1.

Referring to FIGS. 16 and 17, the second transistor T2, the second-first transistor T2-1, and the third transistor T3 may be turned on together by the scan signal SCi and the sensing scan signal SSi that are activated in the first frame OD-F.

In the first frame OD-F, the first data voltage Vd1 is applied through the first data line DL1*j* to the first node N1. The initialization voltage Vi may be applied to the second node N2 through the sensing line SNL*j* and the third transistor T3. Thereafter, as the emission operation of the light emitting element OLED caused by the first transistor T1 is the same as that discussed above in FIG. 8, a description thereof will be omitted.

In the first frame OD-F, the first negative voltage Vn1 is applied through the second data line DL2*j* to the first-first node N1-1. In an embodiment, the first negative voltage Vn1 has a level lower than that of the initialization voltage Vi. Accordingly, the first-first transistor T1-1 may have a negative gate-source voltage.

Because negative bias illumination stress (NBIS) causes the first transistor T1 to have a gate-source voltage less than about 0 V and the first-first transistor T1-1 to receive light, a current-voltage curve of the first-first transistor T1-1 may be shifted leftward (see FIG. 10).

Referring to FIGS. 16 and 18, the second transistor T2, the second-first transistor T2-1, and the third transistor T3 may be turned on together by the scan signal SCi and the sensing scan signal SSi that are activated in the second frame EN-F.

In the second frame EN-F, the second data voltage Vd2 is applied through the second data line DL2*j* to the first-first node N1-1. The initialization voltage Vi may be applied to the second node N2 through the sensing line SNL*j* and the third transistor T3. Thereafter, as the emission operation of the light emitting element OLED caused by the first-first transistor T1-1 is the same as that discussed above in FIG. 9, a description thereof will be omitted.

In the second frame EN-F, the second negative voltage Vn2 is applied through the first data line DL1*j* to the first node N1. In an embodiment, the second negative voltage Vn2 has a level lower than that of the initialization voltage Vi. Accordingly, the first transistor T1 may have a negative gate-source voltage.

Because negative bias illumination stress (NBIS) causes the first transistor T1 to have a gate-source voltage less than about 0 V and the first transistor T1 to receive light, a current-voltage curve of the first transistor T1 may be shifted leftward (see FIG. 10).

In accordance with the operation mentioned above, the current-voltage curves of the first transistor T1 and the first-first transistor T1-1 may be shifted as discussed above in FIGS. 8 to 10. For example, the current-voltage curve of the first transistor T1 may be rightward shifted in the first frame OD-F and leftward shifted in the second frame EN-F.

Similar to the current-voltage curve of the first transistor T1, the current-voltage curve of the first-first transistor T1-1 may be rightward shifted in the second frame EN-F and leftward shifted in the first frame OD-F. Therefore, it may be possible to compensate the degraded states of the first transistor T1 and the first-first transistor T1-1.

Figure 19:
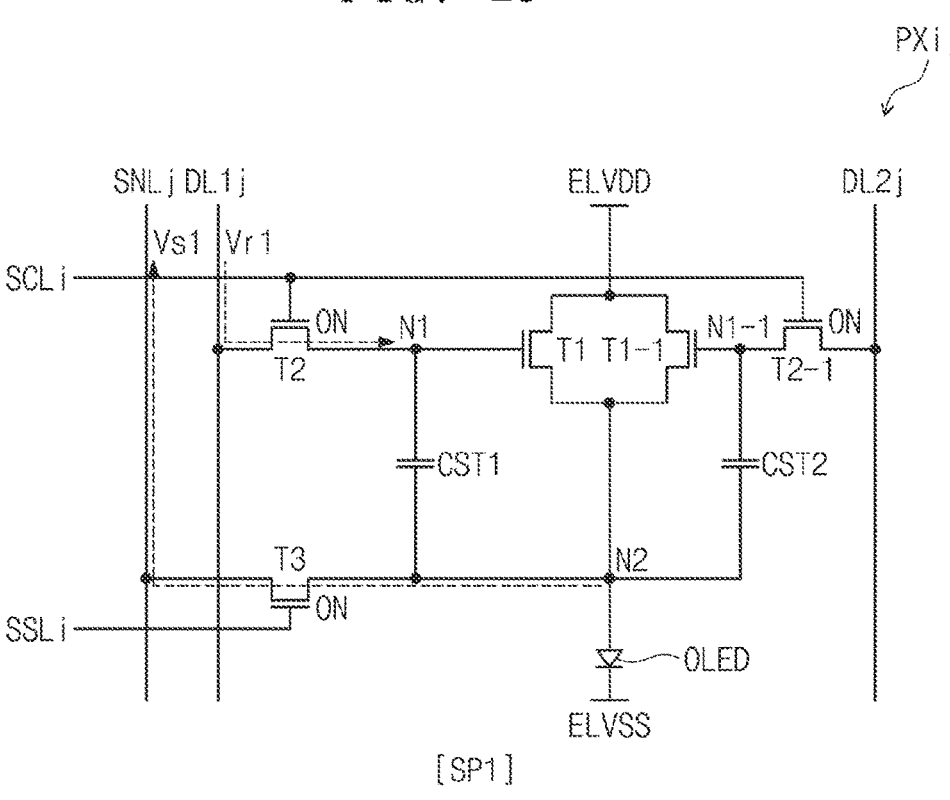
FIG. 19 illustrates an equivalent circuit diagram showing an operation of a second sensing duration in a non-display period depicted in FIG. 16.
Figure 20:
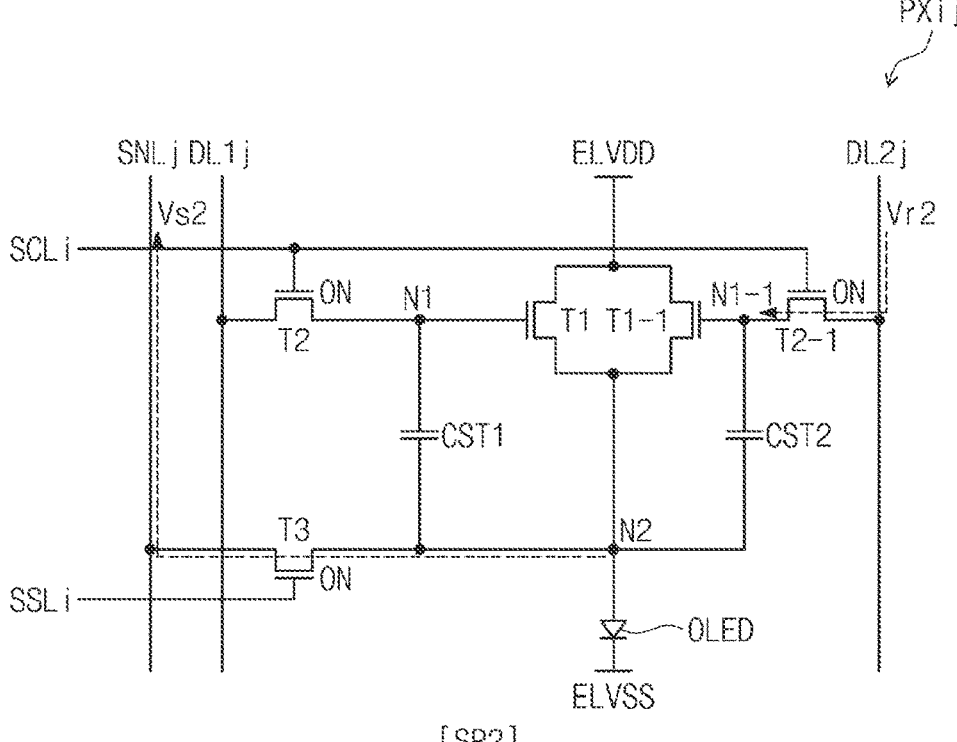
FIG. 20 illustrates an equivalent circuit diagram showing an operation of a second sensing duration in a non-display period depicted in FIG. 16.

FIG. 19 illustrates an equivalent circuit diagram showing an operation of a first sensing duration in a non-display period depicted in FIG. 16 according to an exemplary embodiment. FIG. 20 illustrates an equivalent circuit diagram showing an operation of a first sensing duration in a non-display period depicted in FIG. 16 according to an exemplary embodiment.

Referring to FIGS. 16 and 19, during the first sensing duration SP1, the second transistor T2, the second-first transistor T2-1, and the third transistor T3 are turned on together by an activated scan signal SCi and an activated sensing scan signal SSi. A first reference voltage Vr1 may be applied through the first data line DL1*j* to the first node N1. The gate-source voltage of the first transistor T1 may be output through the sensing line SNL*j* as a first sensing voltage Vs1.

Referring to FIGS. 16 and 20, during the second sensing duration SP2, the second transistor T2, the second-first transistor T2-1, and the third transistor T3 are turned on together by an activated scan signal SCi and an activated sensing scan signal SSi. A second reference voltage Vr2 may be applied through the second data line DL2*j* to the first-first node N1-1. The gate-source voltage of the first-first transistor T1-1 may be output through the sensing line SNL*j* as a second sensing voltage Vs2.

A calculation operation for calculating threshold voltages due to the first and second sensing voltages Vs1 and Vs2 may be substantially the same as that discussed above in FIG. 13. In addition, a compensation operation for compensating a data voltage may be substantially the same as that discussed above in FIG. 14. Accordingly, there may be a reduction in a compensation amount of a data voltage for the pixel PXij.

According to an embodiment of the present invention, when two driver transistors are disposed in a pixel, and when one of the two driver transistors is operated, a degraded state of the other of the two driver transistors may be compensated to allow the other driver transistor to have a leftward shifted current-voltage curve. This compensation operation may be performed in real-time. Therefore, a degraded state of a driver transistor may be compensated to increase a lifespan of the driver transistor.

Although the present invention is described in conjunction with some embodiments thereof, it would be understood by those skilled in the art that the present invention can be modified or changed in various ways without departing from spirit and scope of the present invention defined by the appended claims. Further, the embodiments disclosed herein are not intended to limit the technical spirit of the present invention and all technical spirit within the claims and their equivalents should be construed as being included in the present invention.

What is claimed is:

1. A display device, comprising a plurality of pixels, wherein each of the plurality of pixels comprises:
a first transistor including a control electrode connected to a first node, a first electrode that receives a first voltage, and a second electrode connected to a second node;
a second transistor including a first electrode connected to a data line, a second electrode connected to the first node, and a control electrode connected to a first scan line;
a third transistor including a first electrode connected to a sensing line and a second electrode connected to the second node;
a first-first transistor including a control electrode connected to a first-first node, a first electrode that receives the first voltage, and a second electrode connected to the second node;
a second-first transistor including a first electrode connected to the data line, a second electrode connected to the first-first node, and a control electrode connected to a second scan line;
a light emitting element connected to the second node and receiving a second voltage;
a first capacitor connected to the first node and the second node; and
a second capacitor connected to the first-first node and the second node,
wherein the third transistor is configured to apply an initialization voltage to the second node through the sensing line by a turn-on of the third transistor,
wherein a first scan signal is applied to the first scan line in a first frame period, and
wherein a second scan signal is applied to the second scan line in a second frame period next to the first frame period,
wherein the initialization voltage is applied to the second node with a same timing as application of the first scan signal in the first frame period and application of the second scan signal in the second frame period.

2. The display device of claim 1, wherein
a current-voltage curve of the first transistor is shifted rightward in the first frame period, and
the current-voltage curve of the first transistor is shifted leftward in the second frame period.

3. The display device of claim 2, wherein, in the first frame period,
the second transistor is turned on in response to the first scan signal,
the first transistor is turned on, and
the first-first transistor and the second-first transistor are turned off.

4. The display device of claim 1, wherein
a current-voltage curve of the first-first transistor is shifted rightward in the second frame period, and
the current-voltage curve of the first-first transistor is shifted leftward in the first frame period.

5. The display device of claim 4, wherein, in the second frame period,
the second-first transistor is turned on in response to the second scan signal,
the first-first transistor is turned on, and
the first transistor and the second transistor are turned off.

6. The display device of claim 1, wherein a control electrode of the third transistor is connected to a sensing scan line.

7. The display device of claim 6, wherein, in the first frame period and the second frame period, the third transistor is turned on by a sensing scan signal applied through the sensing scan line.

8. The display device of claim 7, wherein the sensing scan signal is applied to the sensing scan line with a same timing as the application of the first scan signal and the second scan signal.

9. The display device of claim 7, wherein
the second transistor and the third transistor are turned on together in the first frame period, and
the second-first transistor and the third transistor are turned on together in the second frame period.

10. The display device of claim 7, wherein
a non-display period next to a display period includes a first sensing duration and a second sensing duration, the display period includes the first frame period and the second frame period,
in the first and second sensing durations, a reference voltage is applied to the data line,
during the first sensing duration, the second and third transistors are turned on, and a gate-source voltage of the first transistor is sensed and output through the sensing line, and
during the second sensing duration, the second-first and third transistors are turned on, and a gate-source voltage of the first-first transistor is sensed and output through the sensing line.

11. An electronic device comprising a display device, comprising a plurality of pixels, wherein each of the plurality of pixels comprises:
a first transistor including a control electrode connected to a first node, a first electrode that receives a first voltage, and a second electrode connected to a second node;
a second transistor including a first electrode connected to a first data line, a second electrode connected to the first node, and a control electrode connected to a scan line;
a first-first transistor including a control electrode connected to a first-first node, a first electrode that receives the first voltage, and a second electrode connected to the second node;
a second-first transistor including a first electrode connected to a second data line, a second electrode connected to the first-first node, and a control electrode connected to the scan line;
a light emitting element connected to the second node and receiving a second voltage;
a first capacitor connected to the first node and the second node; and
a second capacitor connected to the first-first node and the second node,
wherein an initialization voltage is applied to the second node, and wherein the first-first transistor has a negative gate-source voltage when a first data voltage is applied to the first data line in a first frame period and the first transistor has a negative gate-source voltage when a second data voltage is applied to the second data line in a second frame period, wherein, in the first frame period, the first transistor supplies current to the light emitting element and the first-first transistor does not supply current to the light emitting element, and wherein, in the second frame period, the first-first transistor supplies current to the light emitting element and the first transistor does not supply current to the light emitting element.

12. The electronic device of claim 11, wherein the second frame period is next to the first frame period.

13. The electronic device of claim 12, wherein, in the first frame period, the second data line receives a first negative voltage having a level lower than a level of the initialization voltage.

14. The electronic device of claim 12, wherein, in the second frame period, the first data line receives a second negative voltage having a level lower than a level of the initialization voltage.

15. The electronic device of claim 12, wherein a current-voltage curve of the first transistor is shifted rightward in the first frame period, and the current-voltage curve of the first transistor is shifted leftward in the second frame period.

16. The electronic device of claim 12, wherein a current-voltage curve of the first-first transistor is shifted rightward in the second frame period, and the current-voltage curve of the first-first transistor is shifted leftward in the first frame period.

17. The electronic device of claim 12, wherein, in the first frame period and the second frame period, the second transistor and the second-first transistor are turned on together in response to a scan signal applied through the scan line.

18. The electronic device of claim 17, wherein each of the plurality of pixels further includes a third transistor including a first electrode connected to a sensing line, a second electrode connected to the second node, and a control electrode connected to a sensing scan line, wherein, in the first frame period and the second frame period, the third transistor is turned on by a sensing scan signal applied through the sensing scan line.

19. The electronic device of claim 18, wherein the sensing scan signal is applied with the same timing as the application of the scan signal.

20. The electronic device of claim 18, wherein a non-display period next to a display period includes a first sensing duration and a second sensing duration, the display period includes the first frame period and the second frame period, during the first sensing duration, the second, second-first, and third transistors are turned on, a first reference voltage is applied to the first data line, and the gate-source voltage of the first transistor is sensed and output through the sensing line, and during the second sensing duration, the second, second-first, and third transistors are turned on, a second reference voltage is applied to the second data line, and the gate-source voltage of the first-first transistor is sensed and output through the sensing line.

* * * * *